United States Patent
Park et al.

(10) Patent No.: US 9,652,180 B2
(45) Date of Patent: May 16, 2017

(54) MEMORY DEVICE, MEMORY SYSTEM, AND CONTROL METHOD PERFORMED BY THE MEMORY SYSTEM

(71) Applicants: Youn-Won Park, Suwon-si (KR); Su-Ryun Lee, Suwon-si (KR); Byung-Ki Lee, Hwaseong-si (KR); Sang-Cheol Lee, Hwaseong-si (KR)

(72) Inventors: Youn-Won Park, Suwon-si (KR); Su-Ryun Lee, Suwon-si (KR); Byung-Ki Lee, Hwaseong-si (KR); Sang-Cheol Lee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 284 days.

(21) Appl. No.: 14/163,519

(22) Filed: Jan. 24, 2014

(65) Prior Publication Data

US 2014/0215135 A1   Jul. 31, 2014

(30) Foreign Application Priority Data

Jan. 28, 2013  (KR) ........................ 10-2013-0009508

(51) Int. Cl.
*G06F 12/00* (2006.01)
*G06F 3/06* (2006.01)
(Continued)

(52) U.S. Cl.
CPC ........ *G06F 3/0679* (2013.01); *G11C 11/5628* (2013.01); *G11C 16/10* (2013.01); *G11C 16/344* (2013.01)

(58) Field of Classification Search
None
See application file for complete search history.

(56) References Cited

U.S. PATENT DOCUMENTS 5,548,795 A * 8/1996 Au ........................ G06F 3/0601
   711/4
6,298,425 B1 * 10/2001 Whitaker ............ G06F 11/1435
   711/161

(Continued)

FOREIGN PATENT DOCUMENTS

JP  2007328484 A   12/2007
KR  20100064562 A   6/2010

OTHER PUBLICATIONS

Micron, 2Gb: x8, x16 NAND Flash Memory Features, m69a_2gb_nand.pdf—Rev. H, Sep. 2010.*

*Primary Examiner* — Ryan Bertram
*Assistant Examiner* — Jason Blust
(74) *Attorney, Agent, or Firm* — Harness, Dickey & Pierce, P.L.C.

(57) ABSTRACT

Provided are a memory device, a memory system, and a control method performed by the memory system. The control method includes operations of generating, by a first function block of the memory system, a main request comprising a first sub-request for a first operation that is requested by an external source and a second sub-request for a second operation that is dependent upon a processing result of the first operation; processing, by a second function block of the memory system, the first sub-request or the second sub-request; and when a processing result of the first sub-request performed by the second function block is a fail, transmitting, by a third function block of the memory system, abortion information to the first function block in response to the main request, regardless of processing the second sub-request.

22 Claims, 23 Drawing Sheets

(51) Int. Cl.
*G11C 16/10* (2006.01)
*G11C 11/56* (2006.01)
*G11C 16/34* (2006.01)

(56) References Cited

U.S. PATENT DOCUMENTS

| | | | |
|---|---|---|---|
| 7,433,241 B2 | 10/2008 | Dong et al. | |
| 8,255,618 B1 * | 8/2012 | Borchers | G06F 13/00 |
| | | | 711/103 |
| 8,356,135 B2 | 1/2013 | Son et al. | |
| 8,386,838 B1 * | 2/2013 | Byan | G06F 11/1484 |
| | | | 714/5.11 |
| 2005/0216694 A1 * | 9/2005 | Cohen | G06F 17/30067 |
| | | | 711/173 |
| 2008/0162789 A1 * | 7/2008 | Choi | G11C 11/5628 |
| | | | 711/103 |
| 2010/0026721 A1 | 2/2010 | Park et al. | |
| 2010/0074012 A1 | 3/2010 | Park et al. | |
| 2010/0211820 A1 * | 8/2010 | Kim | G06F 12/0246 |
| | | | 711/154 |
| 2011/0246993 A1 * | 10/2011 | Moir | G06F 9/467 |
| | | | 711/147 |
| 2011/0258480 A1 * | 10/2011 | Young | G06F 3/0613 |
| | | | 711/154 |
| 2012/0304195 A1 * | 11/2012 | Periorellis | G06F 9/52 |
| | | | 718/106 |
| 2014/0136796 A1 * | 5/2014 | Miura | G06F 12/0888 |
| | | | 711/140 |
| 2015/0058529 A1 * | 2/2015 | Lin | G06F 3/0604 |
| | | | 711/103 |

\* cited by examiner

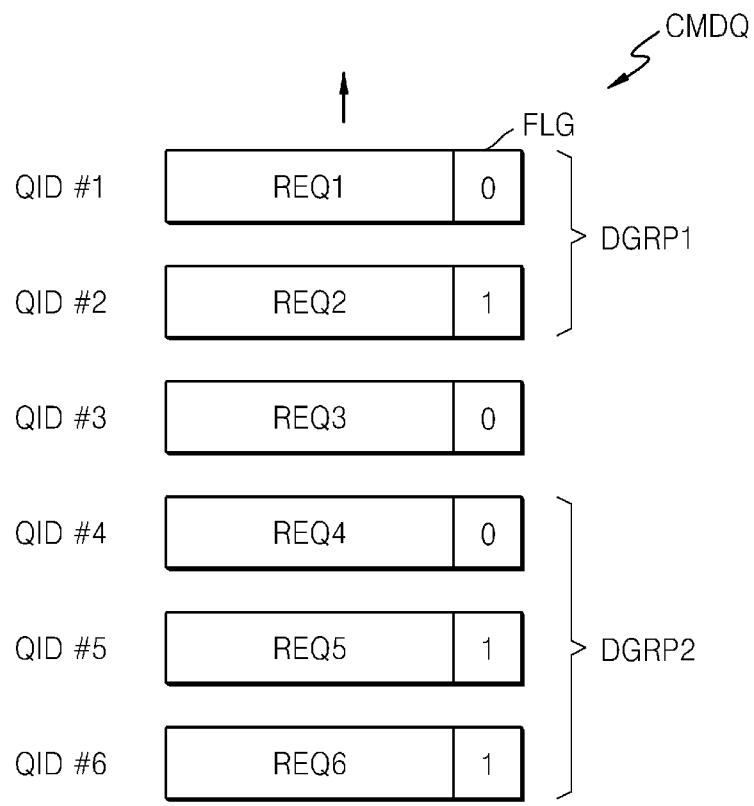

MEMORY DEVICE, MEMORY SYSTEM, AND CONTROL METHOD PERFORMED BY THE MEMORY SYSTEM

CROSS-REFERENCE TO RELATED APPLICATIONS

This application claims the benefit of Korean Patent Application No. 10-2013-0009508, filed on Jan. 28, 2013, in the Korean Intellectual Property Office, the disclosure of which is incorporated herein in its entirety by reference.

BACKGROUND

An embodiment of the inventive concepts relates to a memory device, a memory system, and/or a control method performed by the memory system, and more particularly, to a memory device, a memory system, and/or a control method performed by the memory system capable of improving a function of a device or system.

Due to an increase in an amount of data to be requested by a memory device or a memory system, it becomes important to efficiently control data processing by the memory device or the memory system.

SUMMARY

An embodiment of the inventive concepts provides a memory device, a memory system, and/or a control method performed by the memory system whereby a performance of the memory device or the memory system may be improved.

According to at least one example embodiment, a control method performed by a memory system, the control method including generating a main request, the main request including a first sub-request and a second sub-request, the first sub-request is for a first operation that is requested by an external source, the second sub-request is for a second operation that is dependent upon a processing result of the first operation, the generating is performed by a first function block of the memory system; processing at least one of the first sub-request and the second sub-request, by a second function block of the memory system; and transmitting abortion information to the first function block in response to the main request, when a processing result of the first sub-request performed by the second function block is a fail, the transmitting being performed by a third function block of the memory system, the transmitting being performed even if the processing of the second sub-request is not complete.

According to at least one example embodiment, an input and output processing method performed by a NAND flash memory system including a memory controller and a NAND flash device, the input and output processing method includes generating, by a firmware unit, a main request including a first sub-request and at least one second sub-request, the first sub-request is for a first operation that is requested by an external source, the at least one second sub-request is for a second operation that is dependent upon the first operation, the memory controller including the firmware unit, the firmware unit including a command and data associated with processing a request from the external source; enqueuing at least one of the first sub-request or the second sub-request in a command queue included in the memory controller, the enqueuing is performed by a managing unit that is included in the memory controller and controls the NAND flash device; and processing the first sub-request; and outputting, by the managing unit, abortion information to the first function block in response to the main request, when a processing result of the first sub-request is a fail, the outputting being performed even if the processing of the second sub-request is not complete.

According to at least one example embodiment, a memory system includes a memory device configured to process a first sub-request and a second sub-request that requires an operation that is dependent upon a processing result of the first sub-request; and a memory controller configured to control the memory device to process the first sub-request and the second sub-request, wherein the memory controller includes, a firmware unit including a command and data to process a request from an external source, the firmware unit being configured to output a main request including the first sub-request and the second sub-request, and generate a processing result of the main request; and a managing unit configured to control the memory device, the managing unit being configured to receive the main request, set the first sub-request and the second sub-request as a dependency group, enqueue the first sub-request and the second sub-request in a command queue after the setting, and transmit abortion information to the first function block in response to the main request without controlling processing of the second sub-request, when a processing result of the first sub-request is a fail.

According to at least one example embodiment, a storage system includes a first function block configured to transmit a main request including a first sub-request and a second sub-request, the first sub-request and the second sub-request corresponding to an operation requested by an external source, the second sub-request requiring an operation that is dependent upon a processing result of the first sub-request; a second function block configured to process the first sub-request and the second sub-request; and a third function block configured to control the processing of the first sub-request and the second sub-request by the second function block, and transmit abortion information to the first function block in response to the main request, without controlling the processing by the second function block, when the processing result of the first sub-request is a fail.

A method of controlling a memory system including a memory device and a memory controller configured to control the memory device includes receiving, at the memory system, an external request from an external device, the external request corresponding to at least a first operation and a second operation, the second operation being dependent on the first operation; generating, at a first function block in the memory controller, a main request including a first sub-request for the first operation and a second sub-request for the second operation; processing, at a second function block in the memory device, the first sub-request; determining a result of the processing of the first sub-request; and transmitting abortion information from a third function block in the memory controller to the first function block in response to the main request before the second function block completes processing of the second sub-request, when the result of the processing of the first sub-request indicates that the processing of the first sub-request failed.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted

FIGS. 26 and 27 illustrate examples of a command queue that is included in the third function block;

DETAILED DESCRIPTION OF THE EMBODIMENTS

Figure 1:
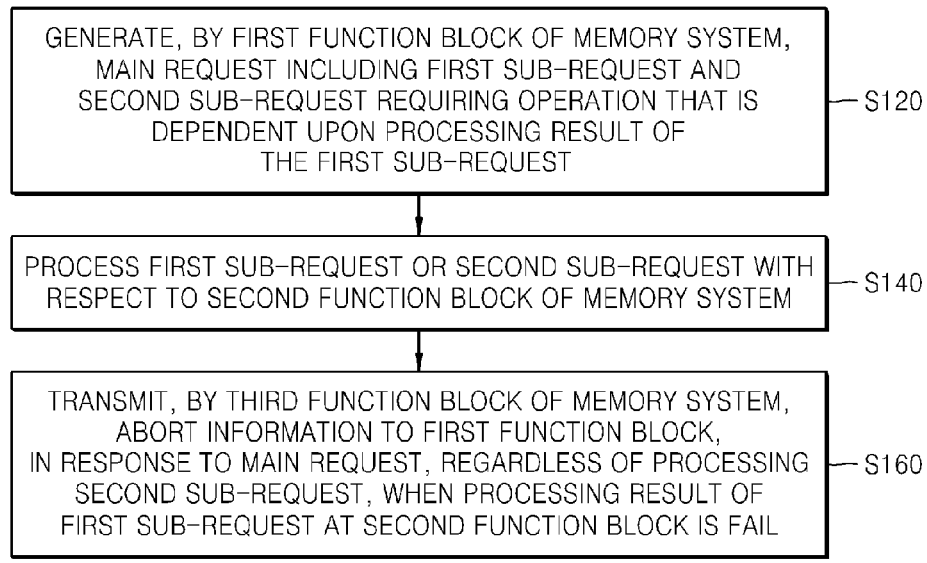
FIG. 1 is a flowchart of a control method performed by a memory system, according to an embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

Expressions such as "at least one of," when preceding a list of elements, modify the entire list of elements and do not modify the individual elements of the list.

Figure 2:
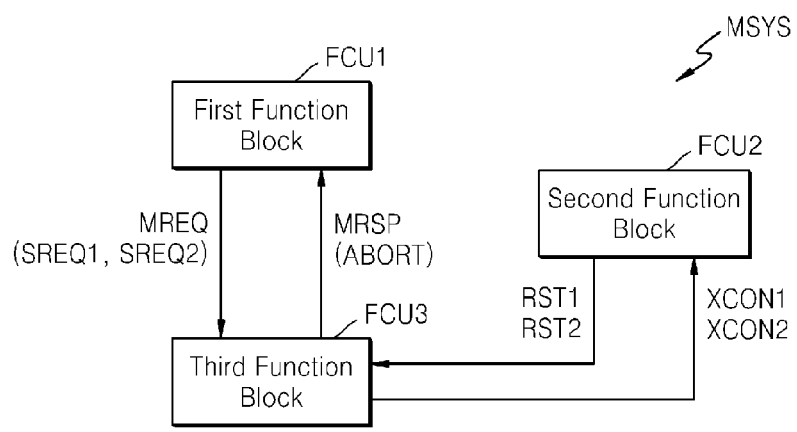
FIG. 2 is a block diagram illustrating the memory system according to an embodiment of the inventive concepts.

FIG. 1 is a flowchart of a control method performed by a memory system MSYS, according to an embodiment of the inventive concepts. FIG. 2 is a block diagram illustrating the memory system MSYS according to an embodiment of the inventive concepts.

Referring to FIGS. 1 and 2, the control method performed by the memory system MSYS involves generating, by a first function block FCU1, a main request MREQ including a first sub-request SREQ1 and a second sub-request SREQ2 (operation S120), processing the first sub-request SREQ1 or the second sub-request SREQ2 with respect to a second function block FCU2 (operation S140), and when a first processing result RST1 of the first sub-request SREQ1 is a fail, not processing the second sub-request SREQ2, and transmitting abortion information ABORT, as a main response MRSP in response to the main request MREQ, to the first function block FCU1 (operation S160).

The first function block FCU1 generates the main request MREQ corresponding to an operation request that is input from an external source (e.g., a host apparatus to be described later). The main request MREQ includes the first sub-request SREQ1 that corresponds to a first operation and the second sub-request SREQ2 that corresponds to a second operation, wherein the first operation and the second operation form the operation request from the external source.

The main request MREQ that is generated by the first function block FCU1 may be input to a third function block FCU3. The main request MREQ may correspond to a request by the host apparatus to the memory system MSYS. As described above, the main request MREQ includes both the first sub-request SREQ1 and the second sub-request SREQ2. Thus, the third function block FCU3 may simultaneously receive processing requests with respect to the first sub-request SREQ1 and the second sub-request SREQ2 from the first function block FCU1.

The third function block FCU3, in response to the main request MREQ from the first function block FCU1, controls the main request MREQ to be processed by the second function block FCU2. For example, the third function block FCU3 may transmit a first control signal XCON1 and a second control signal XCON2 to the second function block FCU2, wherein the first control signal XCON1 and the second control signal XCON2 correspond to the first sub-request SREQ1 and the second sub-request SREQ2, respectively, that are included in the main request MREQ.

The first control signal XCON1 and the second control signal XCON2 may include various types of information that are required by the second function block FCU2 to perform the first sub-request SREQ1 and the second sub-request SREQ2. The third function block FCU3 may simultaneously or sequentially transmit the first control signal XCON1 and the second control signal XCON2. Examples of the first control signal XCON1 and the second control signal XCON2 are described below.

The second function block FCU2 processes the first sub-request SREQ1 and the second sub-request SREQ2, in response to the first control signal XCON1 and the second control signal XCON2, respectively. Then, the second function block FCU2 transmits processing results as the first processing result RST1 and a second processing result RST2 with respect to the first sub-request SREQ1 and the second sub-request SREQ2 to the third function block FCU3. The second function block FCU2 may simultaneously or sequentially transmit the first processing result RST1 and the second processing result RST2 to the third function block FCU3.

Alternatively, the second function block FCU2 may transmit only one of the first processing result RST1 and the second processing result RST2. For example, when one processing result of the first processing result RST1 and the second processing result RST2, which is previously processed, is a fail, the second function block FCU2 may not transmit the other processing result. Alternatively, when one processing result of the first processing result RST1 and the second processing result RST2, which is previously processed, is a fail, the second function block FCU2 may not perform processing with respect to a sub-request other than a sub-request that corresponds to the failed processing result.

Referring to FIGS. 1 and 2, in the present embodiment, the first sub-request SREQ1 and the second sub-request SREQ2 that are included in the main request MREQ are dependent. For example, the second sub-request SREQ2 may be dependent on the first processing result RST1 of the first sub-request SREQ1. Alternatively, the first sub-request SREQ1 may be dependent on the second processing result RST2 of the second sub-request SREQ2. In this case, when the first processing result RST1 is a fail, the second sub-request SREQ2 or the second processing result RST2 may be meaningless. An example of the main request MREQ that includes both the first sub-request SREQ1 and the second sub-request SREQ2 will be described below.

The third function block FCU3 of the memory system MSYS receives the first processing result RST1 or the second processing result RST2 from the second function block FCU2, and then transmits the first processing result RST1 or the second processing result RST2, as the main response MRSP, in response to the main request MREQ, to the first function block FCU1. For example, when the second sub-request SREQ2 depends on the first processing result RST1 of the first sub-request SREQ1, the third function block FCU3 may receive the first processing result RST1 that is processed as a fail, and may transmit the main response MRSP as the abortion information ABORT to the first function block FCU1, regardless of reception of the second processing result RST2 or a detail of the second processing result RST2.

In this case, the first function block FCU1 may process only one main response MRSP, in response to the first sub-request SREQ1 and the second sub-request SREQ2. Thus, the related first and second sub-requests SREQ1 and SREQ2 are simultaneously requested as one main response MRSP from the first function block FCU1, and results thereof are simultaneously processed as one main response MRSP by the first function block FCU1, so that, with respect to a retry of a corresponding main request, an overhead that is caused when the first function block FCU1 separately receives responses to the first sub-request SREQ1 and the second sub-request SREQ2, and performs processes on the responses may be decreased.

For example, error handling, in which the response to the second sub-request SREQ2 is separately searched and cancelled while a processing result of the first sub-request SREQ1 from among the first sub-request SREQ1 and the second sub-request SREQ2 is a fail, may not be performed. Also, an overhead of the first function block FCU1 that has to wait for a response to the first sub-request SREQ1 and then to transmit the second sub-request SREQ2 related to the first sub-request SREQ1 may be decreased.

Referring to FIG. 2, the first function block FCU1 and the third function block FCU3 directly exchange the main request MREQ and the main response MRSP. Also, referring to FIG. 2, the second function block FCU2 and the third function block FCU3 directly exchange the first processing result RST1 and the second processing result RST2, and the first control signal XCON1 and the second control signal XCON2. However, the example of FIG. 2 is for convenience of description. The memory system MSYS according to the present embodiment may further include another function block that performs an exchange of signals that are generated in the first function block FCU1 and the third function block FCU3, or in the second function block FCU2 and the third function block FCU3. The further arrangement may also be applied to other embodiments to be described below.

Referring to FIGS. 1 and 2, each of the first function block FCU1, the second function block FCU2, and the third function block FCU3 may perform a particular function. Various examples of the first function block FCU1, the second function block FCU2, and the third function block FCU3 are illustrated in FIGS. 3 through 5.

Figure 3:
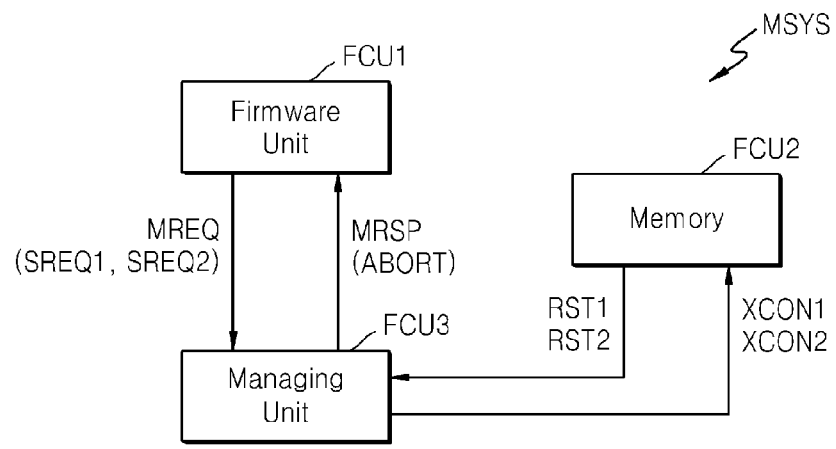
FIGS. 3 through 5 illustrate examples of the memory system of FIG. 2.

For example, as illustrated in FIG. 3, the first function block FCU1 may be a firmware unit. The firmware unit that is embodied as the first function block FCU1 is software that includes commands and data to drive the memory system MSYS and that is stored in a particular storage means so as to be such as hardware. The firmware unit performs machine code processing related to a request from a host apparatus so as to perform the host apparatus' request with respect to the memory system MSYS, data transmission, list processing, floating point calculation, channel control, or the like. The particular storage means may be read-only memory (ROM) or a flash memory.

As illustrated in FIG. 3, the second function block FCU2 may include a memory and the third function block FCU3 may be a managing unit. When the second function block FCU2 includes the memory, the first control signal XCON1 and the second control signal XCON2 may include information about data, an address, a command, and an operating voltage so as to process the first sub-request SREQ1 and the second sub-request SREQ2. Also, the first processing result RST1 and the second processing result RST2 may indicate whether data programming is successful or may be read data.

Figure 4:
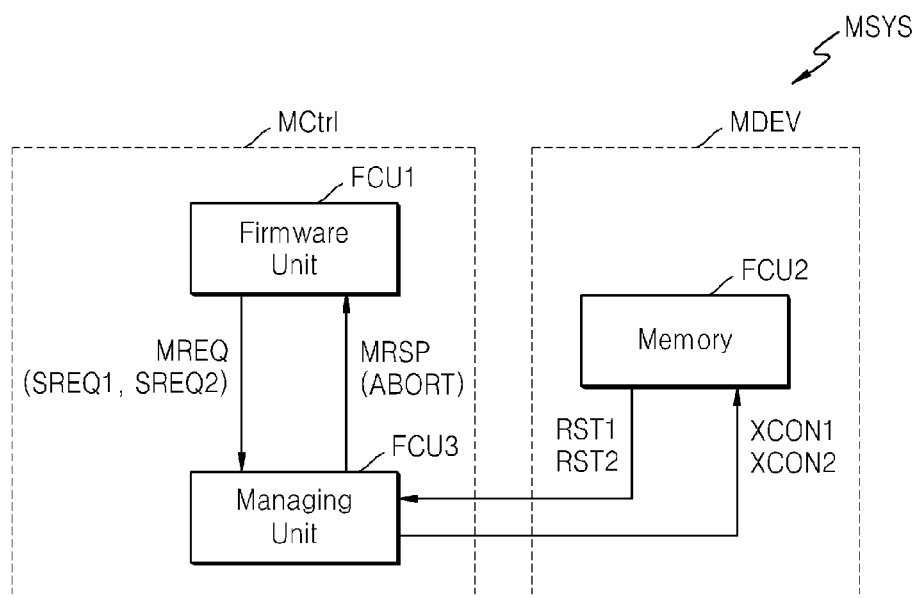
Figure 5:
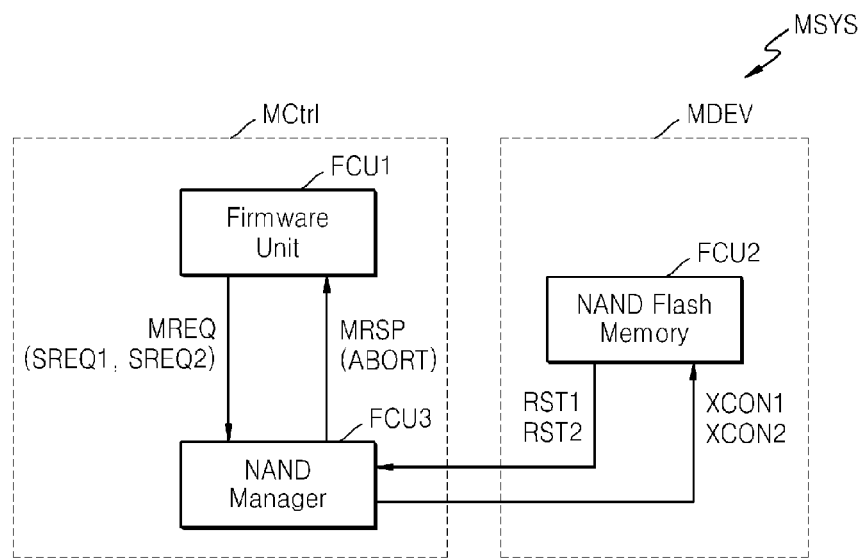

As illustrated in FIG. 4, the first function block FCU1 that is a firmware unit and the third function block FCU3 that is a managing unit may be included in a memory controller MCtrl that controls a memory device MDEV including the second function block FCU2 that includes a memory. Alternatively, the third function block FCU3 may be included in the memory device MDEV or may be included in both the memory controller MCtrl and the memory device MDEV.

The memory that is included in the second function block FCU2 may be a volatile memory, such as DRAM, SRAM, or the like, or may be a non-volatile memory, such as EEPROM, FRAM, PRAM, MRAM, or the like. Alternatively, the memory that is included in the second function block FCU2 may be a flash memory. FIG. 5 illustrates an example in which the memory that is included in the second function block FCU2 is a NAND flash memory.

In the example of FIG. 5, the third function block FCU3 may be a NAND manager that controls an operation by the NAND flash memory as the second function block FCU2. The NAND manager may be a state machine to control the NAND flash memory and may include a command queue which will be described in greater detail below. When the first sub-request SREQ1 and the second sub-request SREQ2 are enqueued in the command queue included in the NAND manager, the NAND manager may analyze the first sub-request SREQ1 and the second sub-request SREQ2 and may transmit the first control signal XCON1 and the second control signal XCON2 to control a NAND operation to the NAND flash memory as the second function block FCU2.

In the example of FIG. 5, in which the second function block FCU2 includes the NAND flash memory, the first function block FCU1 and the third function block FCU3 may be included in a memory controller MCtrl as in the previous embodiment.

Figure 6:
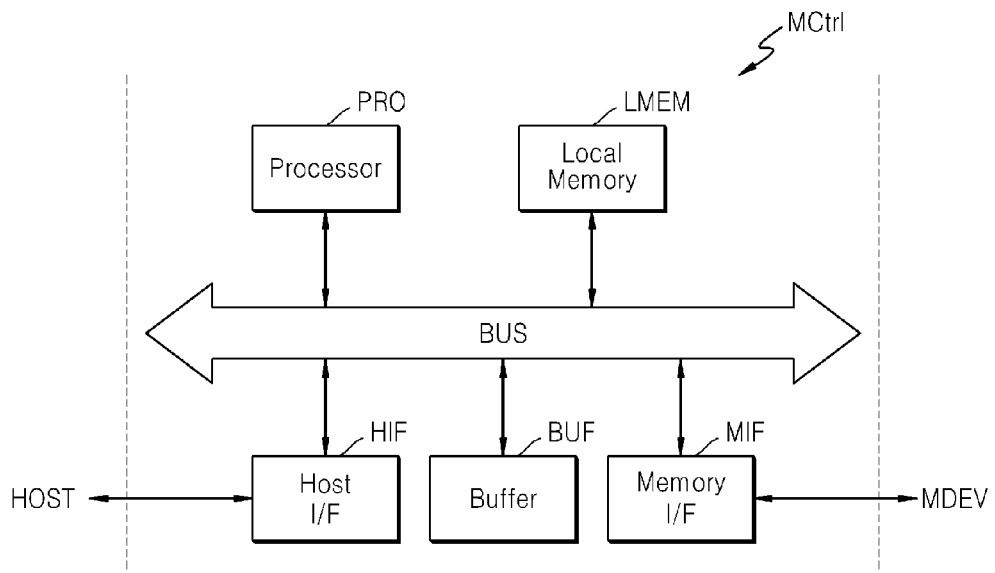
FIG. 6 illustrates an example of a memory controller of FIG. 5.

FIG. 6 illustrates an example of the memory controller MCtrl of FIG. 5. Referring to FIG. 6, in the memory controller MCtrl, a host interface unit HIF, a memory interface unit MIF, a local memory LMEM, a buffer BUF, and a processor PRO may be connected to a bus BUS.

The host interface unit HIF provides an interface with an external host apparatus HOST. For example, the host interface unit HIF may provide, but is not limited to, a Serial Advanced Technology Attachment (SATA) interface or a Serial Attached SCSI (SAS) interface. Alternatively, the host interface unit HIF may provide an interface with the external host apparatus HOST by using various interface protocols such as Universal Serial Bus (USB), Man-Machine Communication (MMC), Peripheral Component Interconnect-Express (PCI-E), Parallel Advanced Technology Attachment (PATA), Small Computer System Interface (SCSI), Enhanced Small Device Interface (ESDI), Intelligent Drive Electronics (IDE), or the like. Also, the host interface unit HIF may include the command queue.

The memory interface unit MIF may provide an interface with the memory device MDEV so as to program data to the memory device MDEV or to read data from the memory device MDEV, in response to a request from the host apparatus HOST. For example, the memory interface unit MIF may provide a result to the memory device MDEV, wherein the result is obtained by transforming a logical block address transmitted from the host apparatus HOST into a physical address of a page in the memory device MDEV.

The buffer BUF may be used for smooth data transmission between the host apparatus HOST and the memory device MDEV. For example, the buffer BUF may temporarily store data to be programmed to the memory device MDEV according to a request from the host apparatus HOST. Additionally or alternatively, the buffer BUF may temporarily store data to be read from the memory device MDEV according to a request from the host apparatus HOST. The buffer BUF may be embodied as a volatile memory, such as DRAM or SRAM, or may be embodied as a non-volatile memory, such as MRAM, PRAM, FRAM, or a flash memory.

The local memory LMEM may load or store data and a control module or a control program which is used by the memory controller MCtrl to control a request from the host apparatus HOST to be processed in the memory device MDEV. For example, the firmware unit that is the first function block FCU1 may be embodied in the local memory LMEM. In addition, the local memory LMEM may load or store an operating system and a mapping table that is referred to perform address mapping. Similar to the buffer BUF, the local memory LMEM may be embodied as a volatile memory, such as DRAM or SRAM, or may be embodied as a non-volatile memory, such as MRAM, PRAM, FRAM, or a flash memory. However, when the local memory LMEM is formed as a firmware unit, the local memory LMEM may be embodied as a non-volatile memory. The local memory LMEM may be formed of one or more same memories or different memories.

The processor PRO controls an operation of each element in the memory controller MCtrl, interprets and executes the control module or the control program that is stored in or loaded to the local memory LMEM, and thus processes a request from the host apparatus HOST.

Figure 7:
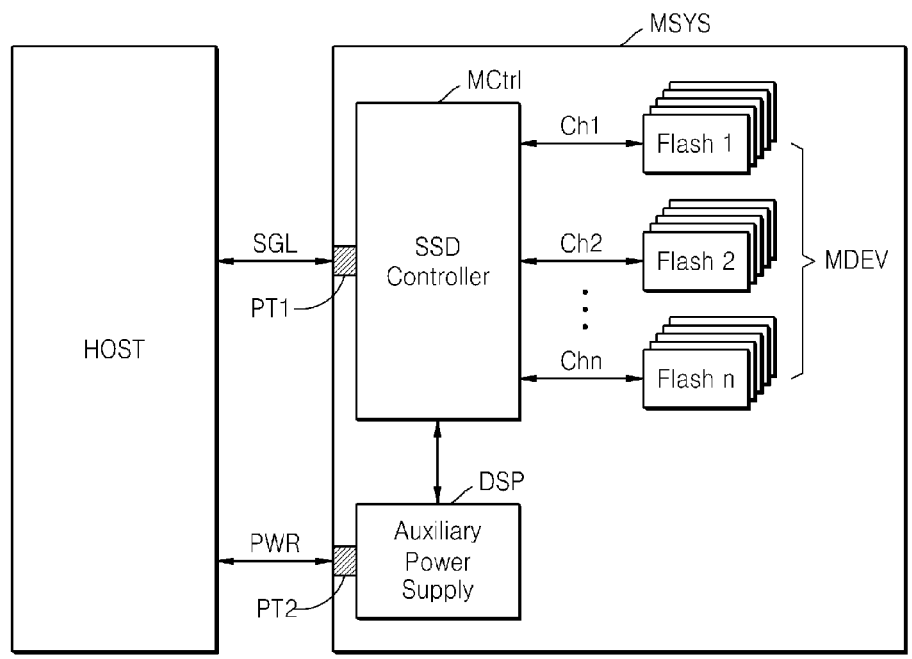
FIG. 7 is a block diagram of an example in which the memory system of FIG. 5 is applied to a solid state drive (SSD), according to an embodiment of the inventive concepts.

When the memory system MSYS includes a solid state drive (SSD) or is included in an SSD, the memory controller MCtrl of FIG. 6 may be included in an SSD controller MCtrl of FIG. 7.

FIG. 7 is a block diagram of an example in which the memory system MSYS is applied to an SSD, according to an embodiment of the inventive concepts.

Referring to FIG. 7, the SSD (i.e., the memory system MSYS) includes an SSD controller MCtrl and a memory device MDEV. The SSD MSYS controller MCtrl controls the memory device MDEV in response to a signal SGL that is received from a host apparatus HOST via a first port PT1 of the SSD. The SSD controller MCtrl may be connected to the memory device MDEV via a plurality of channels Ch1 through Chn. The memory device MDEV may include a plurality of NAND flash memories. However, additionally or alternatively, the memory device MDEV may include flash memories other than NAND flash memories or non-volatile memories other than flash memories.

The SSD may further include an auxiliary power supply DSP and thus may receive power PWR from the host apparatus HOST via a second port PT2. Alternatively, the SSD may receive power from an external power source other than the host apparatus HOST.

The SSD may output a result that is a signal SGL, which is obtained by processing the request from the host apparatus HOST, via the first port PT1. The signal SGL output from the SSD may be the main response MRSP.

The aforementioned control performed by the memory controller MCtrl or the SSD controller MCtrl with respect to the request from the host apparatus HOST may be performed by using the data and commands that are set by the firmware unit FCU1. When the memory system MSYS includes the SSD, as illustrated in FIG. 7, the firmware unit FCU1 may be as illustrated in FIG. 8.

Figure 8:
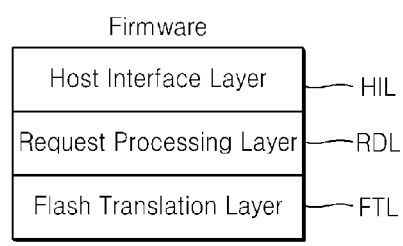
FIG. 8 conceptually illustrates a firmware unit of FIG. 5, according to an embodiment of the inventive concepts.

FIG. 8 conceptually illustrates a firmware unit according to an embodiment of the inventive concepts. Referring to FIGS. 5, 7, and 8, firmware that is included in the firmware unit may include a host interface layer HIL and a flash transform layer FTL. The host interface layer HIL processes a command from the host apparatus HOST. For example, the host interface layer HIL may include functions, such as machine code processing related to the request SGL from the host apparatus HOST, data transmission, or the like.

The flash transform layer FTL may perform a control or resource allocation so as to map an address, which is received from the host apparatus HOST, with a physical address of the memory device MDEV, according to the command that is processed in the host interface layer HIL. The buffer BUF of FIG. 6 may perform buffering of data that is required for the mapping, and the local memory LMEM of FIG. 6 may store a mapping table that is required for the mapping.

FIG. 8 illustrates an example in which the firmware further includes a request processing layer RDL. The request processing layer RDL of FIG. 8 may perform the control method by the memory system MSYS of FIG. 1. For example, the request processing layer RDL of the firmware may transmit the main request MREQ, including the first sub-request SREQ1 and the second sub-request SREQ2, which corresponds to the request SGL from the host apparatus HOST, to the third function block FCU3, may receive the main response MRSP in response to the transmission, and then may perform processing that corresponds to the main response MRSP.

While FIG. 8 illustrates the example in which the request processing layer RDL and the host interface layer HIL are formed as separate layers, this is only for convenience of description. That is, the request processing layer RDL may be included in the host interface layer HIL.

Figure 9:
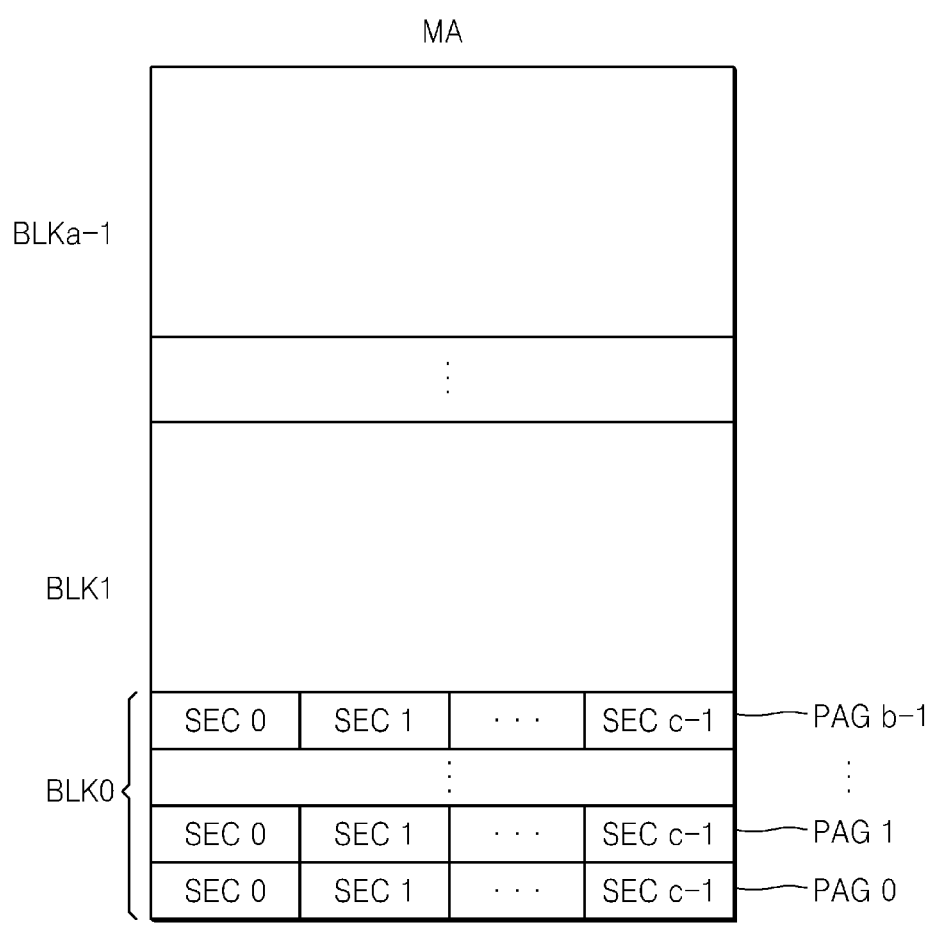
FIG. 9 illustrates a structure of a memory cell array included in a NAND flash memory of FIG. 5.

FIG. 9 illustrates a structure of a memory cell array MA included in the NAND flash memory of FIG. 5.

Referring to FIGS. 5 and 9, the memory device MDEV of the memory system MSYS may include the memory cell array MA. The memory cell array MA may have a (here, a is an integer equal to or greater than 2) blocks BLK0 through BLKa−1, each of the blocks BLK0 through BLKa−1 may have b (here, b is an integer equal to or greater than 2) pages PAG0 through PAGb−1, and each of the pages PAG0 through PAGb−1 may include c (here, c is an integer equal to or greater than 2) sectors SEC0 through SECc−1. For convenience of description, FIG. 9 only illustrates pages PAG0 through PAGb−1 and sectors SEC0 through SECc−1 of the block BLK0. However, the other blocks BLK1 through BLKa−1 may have the same structure as that of the block BLK0.

Figure 10:
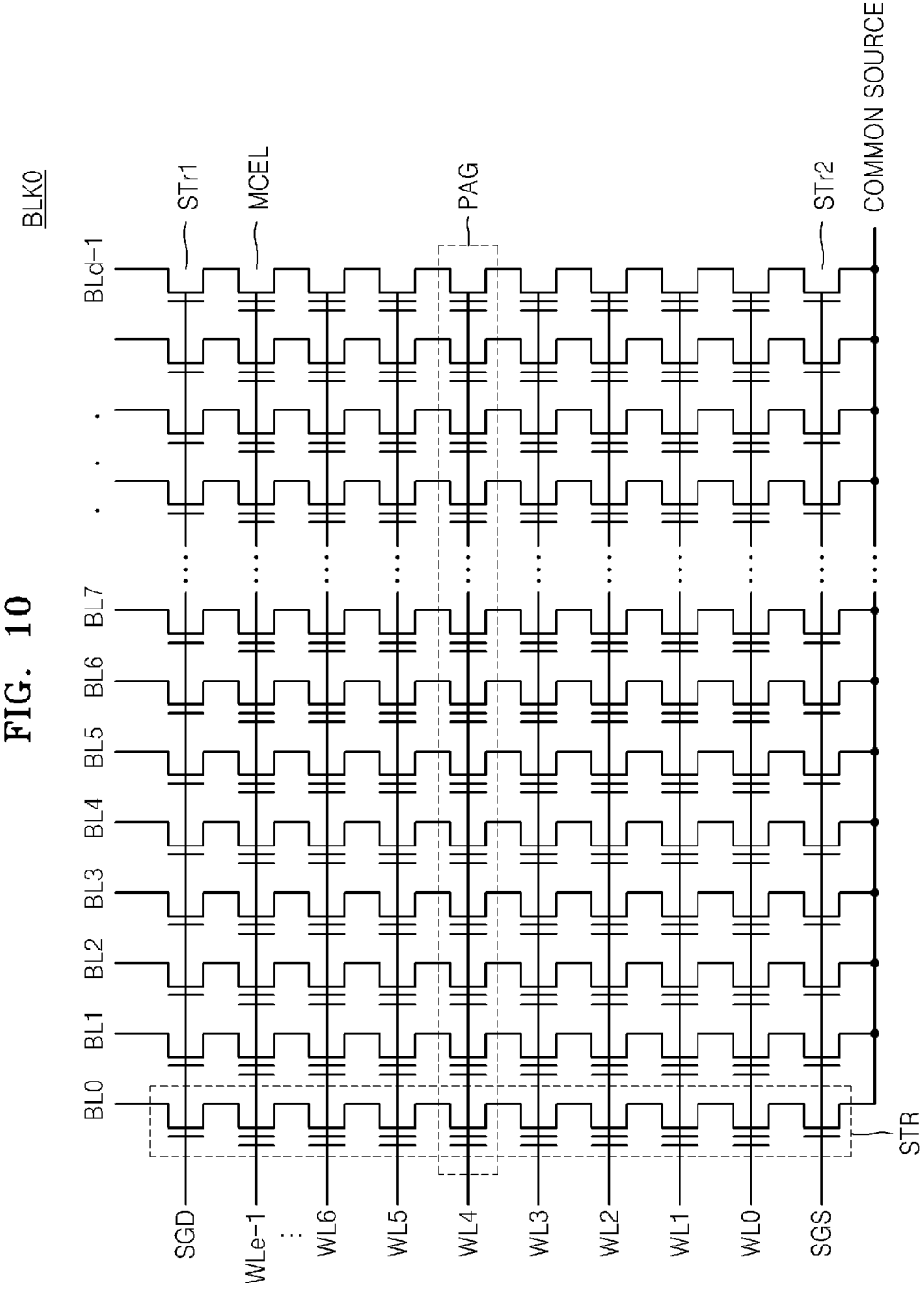
FIG. 10 illustrates an example of a block of FIG. 9.

FIG. 10 illustrates an example of the block BLK0 of FIG. 9.

Referring to FIGS. 9 and 10, each of the blocks BLK0 through BLKa−1 may be formed of d (here, d is an integer equal to or greater than 2) strings STR in which e memory cells MCEL are connected in series in a direction of bit lines BL0 through BLd−1, respectively. Also, each of the strings STR may include a drain selection transistor STr1 and a source selection transistor STr2 that are respectively connected to ends of the memory cells MCEL that are connected in series.

In the present embodiment, the NAND flash memory performs an erase operation in units of blocks, and performs a program operation in units of pages PAG that correspond to word lines WL0 through WLe−1, respectively. The memory device MDEV may include a plurality of memory cell arrays that have the same structure as that of the memory cell array MA and that perform the same operation as that of the memory cell array MA.

Figure 11:
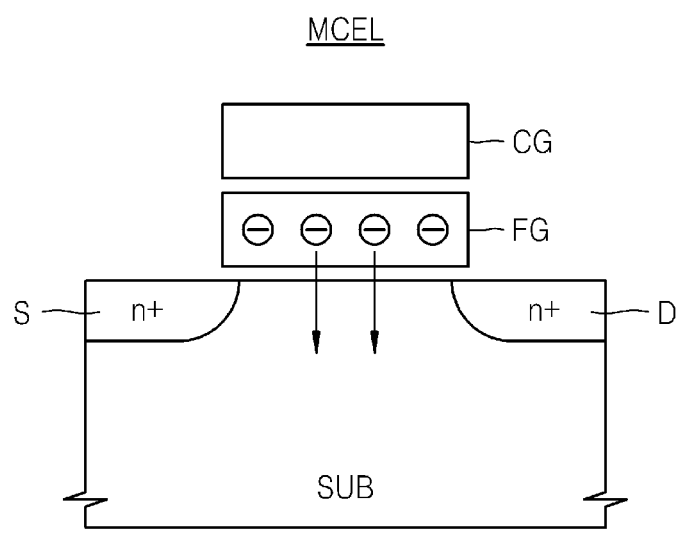
FIG. 11 is a cross-sectional view illustrating an example of a memory cell of FIG. 10.

Each of the memory cells MCEL of FIG. 10 may be formed as illustrated in FIG. 11. Referring to FIG. 11, a source S and a drain D may be formed in a substrate SUB, and a channel region may be formed between the source S and the drain D. A floating gate FG is formed above the channel region, and an insulating layer, such as a tunneling insulating layer, may be arranged between the channel region and the floating gate FG. A control gate CG may be formed above the floating gate FG, and an insulating layer, such as a blocking insulating layer, may be arranged between the floating gate FG and the control gate CG. Voltages that are required for program, erase, and read operations with respect to each memory cell MCEL may be applied to the substrate SUB, the source S, the drain D, and the control gate CG.

The NAND flash memory of FIG. 10 may read data stored in each memory cell MCEL by distinguishing between threshold voltages Vth of the memory cells MCEL. The threshold voltage Vth of each memory cell MCEL may be determined according to an amount of electrons stored in the floating gate FG. For example, the larger the amount of electrons stored in the floating gate FG is, the higher the threshold voltage Vth of each memory cell MCEL may be.

With respect to a predetermined range of the threshold voltage Vth of each memory cell MCEL, data of one bit, two bits, or at least three bits may be set. In correspondence to this setting, one or more pages may be set to each of the word lines WL0 through WLe−1 of FIG. 10. In other words, one or more pages may be programmed to each of the word lines WL0 through WLe−1.

FIG. 12 illustrates distributions of a threshold voltage according to program states that are set to the memory cell array MA of FIG. 9.

Figure 12A:
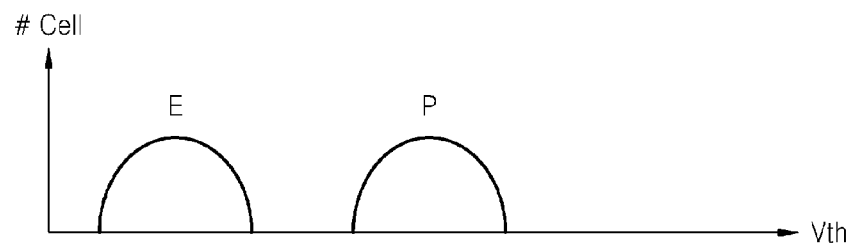
FIGS. 12A, 12B and 12C illustrate distributions of a threshold voltage according to program states that are set to the memory cell array of FIG. 9.

Referring to FIG. 12, the memory device MDEV may include the NAND flash memory in which one-bit data is set with respect to each cell distribution, i.e., a range of each threshold voltage Vth as shown in FIG. 12(a). The NAND flash memory having the aforementioned structure is called a single-level cell (SLC) NAND flash memory. Each memory cell MCEL of the SLC NAND flash memory may be programmed with one-bit data. In the SLC NAND flash memory, one page may be set to each of the word lines WL0 through WLe−1 of FIG. 10.

Figure 12B:
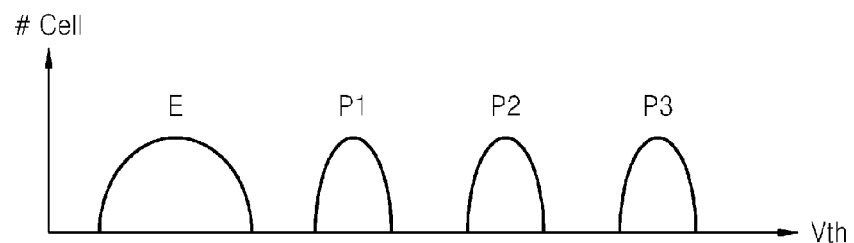
Figure 12C:
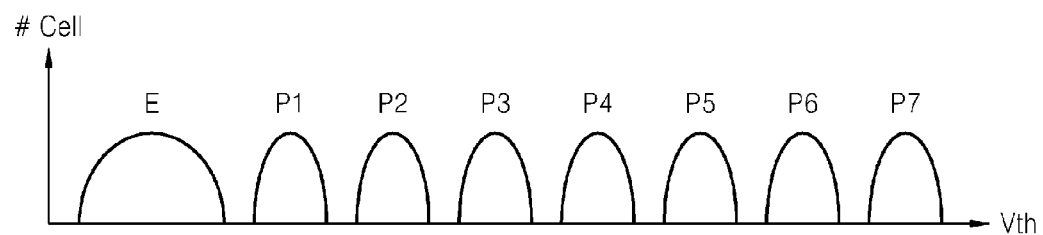

Alternatively, the memory device MDEV may include the NAND flash memory in which at least two-bit data is set with respect to each cell distribution, i.e., a range of each threshold voltage Vth as shown in FIG. 12(b) or 12(c). The NAND flash memory having the aforementioned structure is called a multi-level cell (MLC) NAND flash memory. Each memory cell MCEL of the MLC NAND flash memory may be programmed with at least two-bit data. In the MLC NAND flash memory, at least two pages may be set to each of the word lines WL0 through WLe−1 of FIG. 10.

In this regard, the NAND flash memory in which three-bit data is programmed to each memory cell may be called a triple-level cell (TLC) NAND flash memory. However, for convenience of description, hereinafter, the NAND flash memory in which at least two-bit data is programmed to each memory cell is collectively referred to as the MLC NAND flash memory.

As described above, the memory device MDEV may include the SLC NAND flash memory or the MLC NAND flash memory. However, in another embodiment, the memory device MDEV may include both the SLC NAND flash memory and the MLC NAND flash memory. Alternatively, the memory device MDEV may allow some of the blocks BLK0 through BLKa−1 to program data in an SLC manner and the rest of the blocks BLK0 through BLKa−1 to program data in an MLC manner.

Since a size of data to be processed by a memory device or a memory system is increased, and there is a demand for the memory device or the memory system to be highly integrated or to be minimized, a total number of bits of data to be programmed to a memory cell are increased. In order to store a great amount of data and simultaneously to increase a processing speed or to maintain reliability by using limited resources, various control schemes are applied to the memory device or the memory system. Accordingly, an overhead that is caused when some sub-requests that are included in a program request or a read request with respect to user data or metadata of the memory device are processed as a fail and then the program request or the read request is retried is also increased.

In this regard, when the memory device, the memory system, and the control method performed by the memory system according to embodiments of the inventive concepts process the program request or the read request, the memory device, the memory system, and the control method may simultaneously perform a plurality of requests (e.g., the first sub-request SREQ1 and the second sub-request SREQ2) that are related to or dependent upon each other, and may process them via the same response, so that it is possible to reduce an overhead that is caused when some of the plurality of requests that are related to or dependent upon each other are processed as a fail and thus are retried. Hereinafter, structures and operations of the memory device, the memory system, and the control method performed by the memory system according to the embodiments of the inventive concepts are described in detail.

Figure 13A:
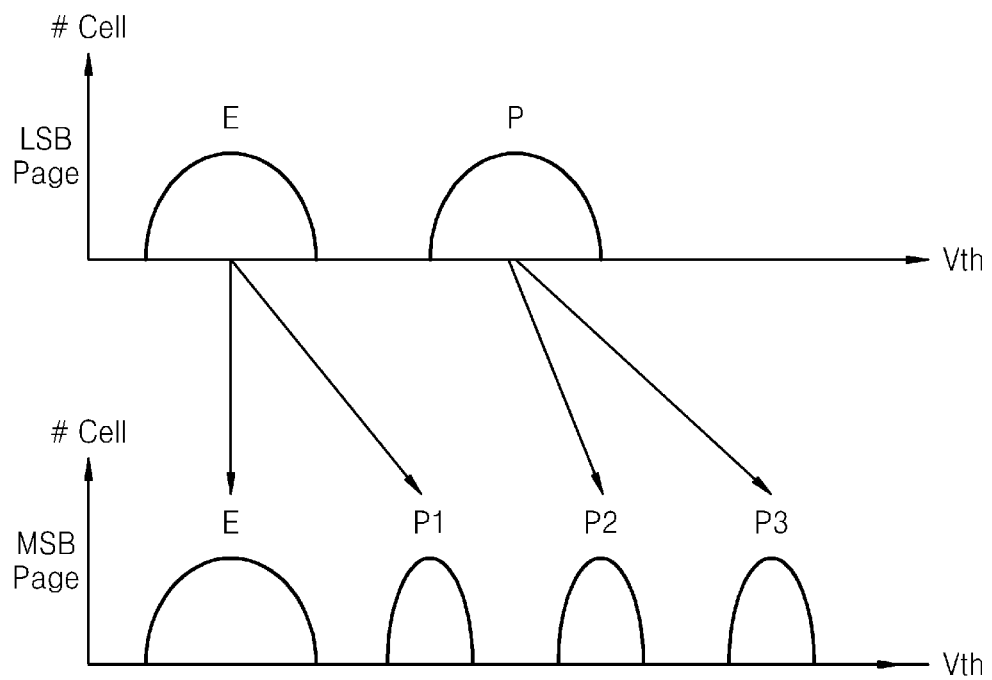
FIGS. 13A, 13B and 14 illustrate an example of the control method of FIG. 1, according to another embodiment of the inventive concepts.
Figure 13B:
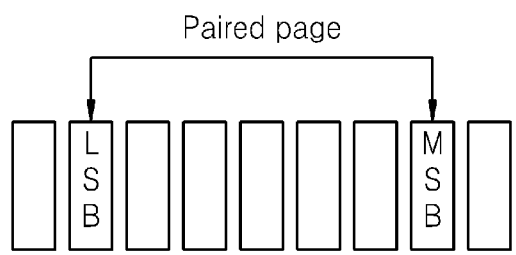
Figure 14:
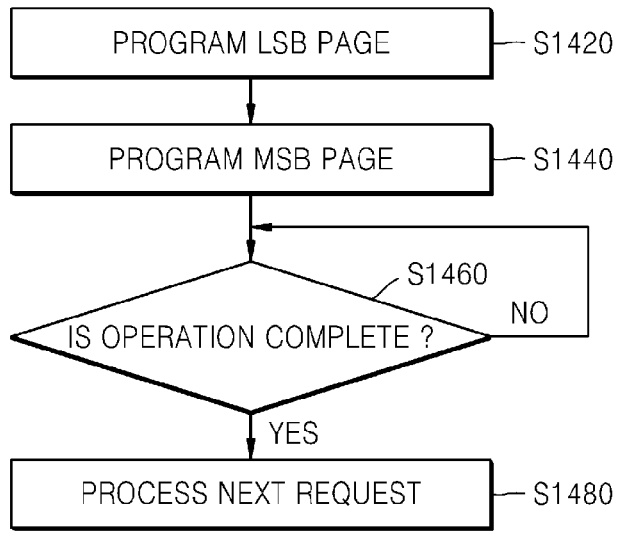

FIGS. 13 and 14 illustrate an example of the control method of FIG. 1, according to another embodiment of the inventive concepts.

Referring to FIGS. 1, 2, and 13(a), the memory system MSYS may store 2-bit data in a memory cell of a memory included in the second function block FCU2. The 2-bit data is composed of a least significant bit (LSB) and a most significant bit (MSB). The LSB and the MSB are programmed with respect to the same word line in a memory cell array but configure two different pages, thus, the LSB and the MSB are programmed to different page addresses.

Here, the page for the LSB is referred as an LSB page, and the page for the MSB is referred as an MSB page. The LSB page and the MSB page that are programmed to the different pages may be connected by using a paired page structure shown in FIG. 13(b). For example, an LSB page and an MSB page that form a pair may be set with respect to page addresses that are separated from each other by a predetermined number of pages. Alternatively, a parity page or a table including information about the LSB page and the MSB page that form the pair may be separately arranged.

As illustrated in FIG. 13(a), the MSB page may be programmed based on a program result of the LSB page. Thus, when a program with respect to the LSB page is processed as a fail, a program with respect to the MSB page that forms the pair with the LSB page may not be normally performed. In another case, when a power supply is suddenly cut while the MSB page is programmed, a program state of the LSB page that forms the pair with the MSB page may not be assured. Thus, a program request for the LSB page and a program request for the MSB page may be related to or dependent upon each other.

In the example of FIG. 13, the main request MREQ of FIGS. 1 and 2 may include a program command with respect to the second function block FCU2, the first sub-request SREQ1 may include a program command for a backup of the LSB page of the second function block FCU2, and the second sub-request SREQ2 may include a program request with respect to the MSB page of the second function block FCU2 which forms the pair with the LSB page of the first sub-request SREQ1. The program command for the backup of the LSB page includes an operation of reading the LSB page stored in a word line to be programmed with the MSB page and then programming the LSB page to a reserved block. This is because, as described above, when the power supply is suddenly cut while the MSB page is programmed, the program state of the LSB page that forms the pair with the MSB page may not be assured.

The control method by the memory system with respect to the example of FIG. 13 may be performed according to a flowchart of FIG. 14. For example, in the memory system MSYS in which the MLC NAND flash memory is arranged as the second function block FCU2, the main request MREQ with respect to the second function block FCU2 includes a first sub-request SREQ1 for a program for a backup of the LSB page and a second sub-request SREQ2 for a program to the MSB page. Accordingly, the LSB page is programmed (operation S1420), and the MSB page is programmed (operation S1440).

After an elapse of a predetermined clock, it is determined whether an operation of the main request MREQ is completely performed (operation S1460). When the operation of the main request MREQ is not completely performed ('NO' in operation S1460), the completion of the operation may be periodically checked. Although not illustrated in FIG. 14, if the operation of the main request MREQ is not completely performed after a predetermined number of checks, the main response MRSP for the main request MREQ may be processed as a fail. This may be equally applied to checking operations with respect to completion of operations to be described below.

Otherwise, when the operation of the main request MREQ is completely performed ('YES' in operation S1460), a next request is performed (operation S1480). The next request after the main request MREQ may be a request that is received in a command queue after the main request MREQ is received in the command queue.

Figure 15:
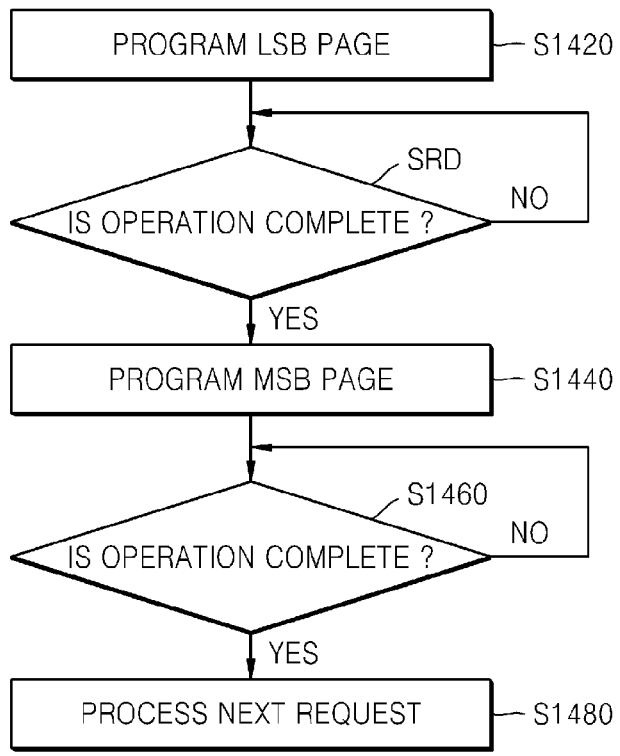
FIG. 15 illustrates a control method according to a comparative example with respect to the control method of FIG. 14.

The program to the MSB page shown in operation S1440 of the flowchart of FIG. 14 may be performed, regardless of a result (a first processing result RST1) of the program that is performed on the LSB page (operation S1420). In this regard, in a flowchart of FIG. 15 that is a comparative example with respect to the control method by the memory system according to the embodiment of FIG. 14, after a program to the LSB page is completely performed ('YES' of SRD), a program to the MSB page may be performed.

As described above, according to the control method by the memory system in the flowchart of FIG. 14, the program request for the LSB page and the program request for the MSB page that are related to each other may be separately performed, regardless of respective processing results, an overhead of the first function block FCU1 (e.g., the firmware unit) may be minimized.

The control method by the memory system in the flowchart of FIG. 14 may also be applied to the MLC NAND flash memory of at least two-bit data. For example, in the MLC NAND flash memory of 3-bit data, a program request for a central significant bit (CSB) page may be related to program requests for the LSB page and the MSB page, and the three program requests may be formed as one main request MREQ and then may be processed together. Detailed descriptions thereof are omitted here.

Figure 16:
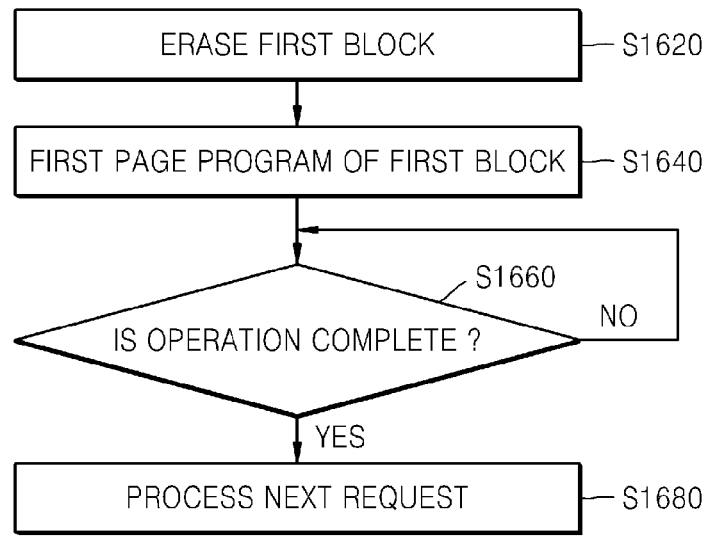
FIG. 16 illustrates an example of the control method of FIG. 1, according to another embodiment of the inventive concepts.

FIG. 16 illustrates an example of the control method of FIG. 1, according to another embodiment of the inventive concepts.

Referring to FIGS. 1, 2, and 6, the control method by the memory system according to the present embodiment may involve erasing a first block in response to the first sub-request SREQ1 (operation S1620) and programming a first page in response to the second sub-request SREQ2, regardless of completion of the erase of the first block (operation S1640).

In the embodiment of FIG. 16, the main request MREQ may include a program command for a first memory block of the second function block FCU2, the first sub-request SREQ1 may include an erase command for the first memory block, and the second sub-request SREQ2 may include a program command for a first page of the first memory block. The second function block FCU2 may include the NAND flash memory of FIG. 5, the first memory block may be one of the blocks BLK0 through BLKa–1 of FIG. 9, and the first page may be one of the pages PAG0 through PAGb–1 of FIG. 9.

The control method according to the embodiment of FIG. 16 may be performed when a new memory block is allocated, upon a program request for the NAND flash memory. In the NAND flash memory, in which an erase unit and a program unit are different from each other and an overwrite is not allowed, when a program-target page is included in the memory block that is newly allocated, an erase request (the first sub-request SREQ1) for the memory block and a program request (the second sub-request SREQ2) for the program-target page may be requested together as the main request MREQ in order to increase a processing speed. However, when the erase request for the memory block is processed as a fail, a result of the program request for the program-target page may not be reliable. Thus, the erase request for the memory block and the program request for the program-target page included in the memory block may be related to each other.

Figure 17:
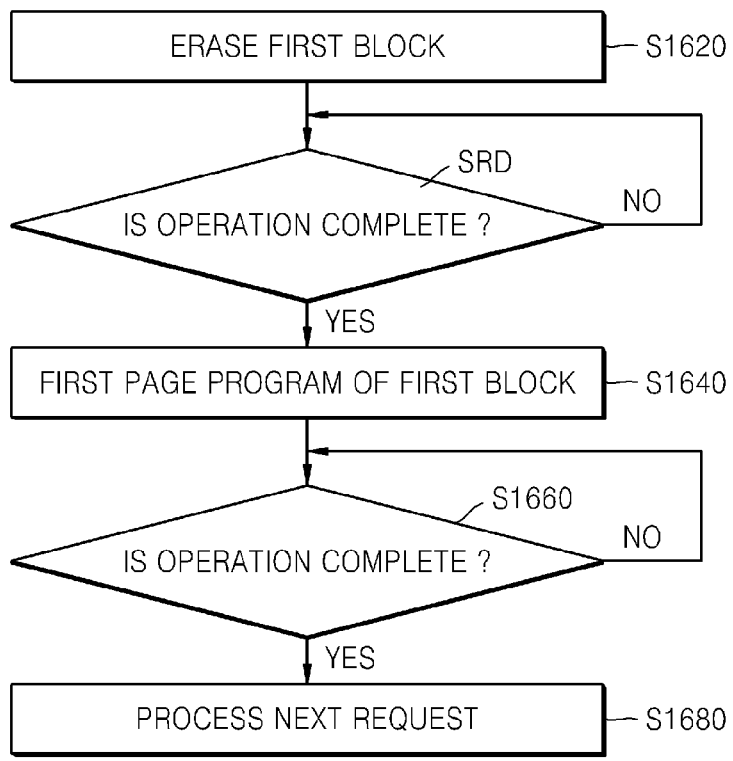
FIG. 17 illustrates a control method according to a comparative example with respect to the control method of FIG. 16.

As described above, the control method according to the embodiment of FIG. 16 may separately perform the erase request for the memory block and the program request that is for the program-target page included in the memory block and that is related to the erase request, regardless of respective processing results, so that an overhead of the firmware unit that is the first function block FCU1 may be decreased. In this regard, the control method by the memory system according to the embodiment of FIG. 16 is different from a method of a flowchart of FIG. 17 that is a comparative example in which, after an erase request for a memory block is completely processed ('YES' of SRD), a program request for a page included in the memory block is processed.

In the embodiment of FIG. 16, a check of whether the erase request for the memory block and the program request for the program-target page included in the memory block are complete (operation S1660), and a process for a next request (operation S1680) may be the same as those in the embodiment of FIG. 14, thus, detailed descriptions thereof are omitted here.

Figure 18:
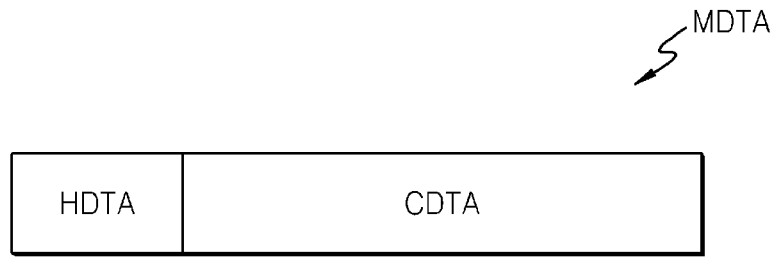
FIGS. 18 and 19 illustrate an example of the control method of FIG. 1, according to another embodiment of the inventive concepts.
Figure 19:
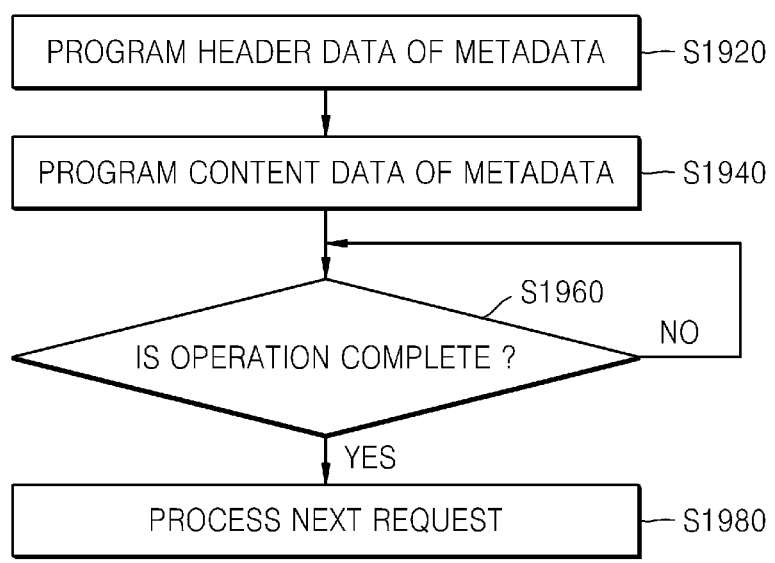

FIGS. 18 and 19 illustrate an example of the control method of FIG. 1, according to another embodiment of the inventive concepts.

Referring to FIGS. 1, 2, and 18, the second function block FCU2 of the memory system MSYS may store metadata MDTA in a storage area. The storage area of the second function block FCU2 may be the aforementioned memory.

The metadata MDTA may be used in efficiently programming user data to the storage area of the second function block FCU2 or reading the user data. For example, the metadata MDTA may include information about a storage location of the user data at the storage area of the second function block FCU2, an attribute of the user data, or an invalid area of the storage area.

As illustrated in FIG. 18, the metadata MDTA may include header data HDTA and content data CDTA. The content data CDTA may correspond to the information about the storage location of the user data at the storage area of the second function block FCU2, the attribute of the user data, or the invalid area of the storage area. The header data HDTA may correspond to information about whether an access to the content data CDTA is possible or not, index information about the content data CDTA, or the like.

Thus, while a process of a program request for the header data HDTA of the metadata MDTA is not passed, a program request for the content data CDTA may not be normally performed. Thus, the program request for the header data HDTA of the metadata MDTA and the program request for the content data CDTA of the metadata MDTA may be related to each other.

In the example of FIG. 18, the main request MREQ shown in FIGS. 1 and 2 may include a program command for the metadata MDTA, the first sub-request SREQ1 may include the program command for the header data HDTA of the metadata MDTA, and the second sub-request SREQ2 may include the program command for the content data CDTA of the metadata MDTA.

With respect to the example of FIG. 18, the control method by the memory system may be performed according to a flowchart of FIG. 19. For example, the control method by the memory system according to the flowchart of FIG. 19 may involve programming the header data HDTA of the metadata MDTA in response to the first sub-request SREQ1 (operation S1920), and programming the content data CDTA of the metadata MDTA in response to the second sub-request SREQ2, regardless of whether the programming of the header data HDTA is complete (operation S1940).

Figure 20:
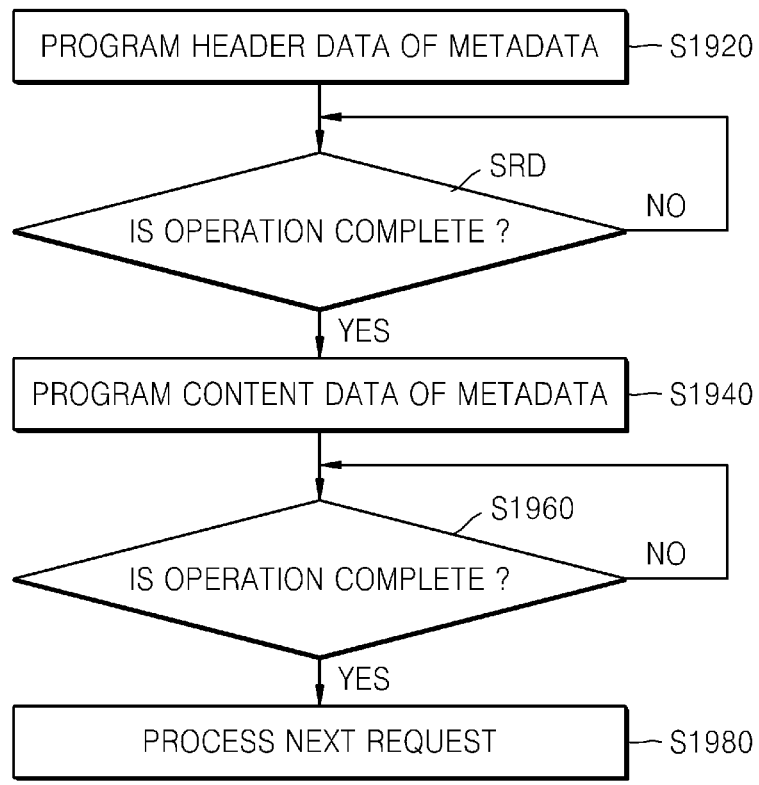
FIG. 20 illustrates a control method according to a comparative example with respect to the control method of FIG. 19.

As described above, the control method according to the embodiment of FIG. 19 may separately perform the program request for the header data HDTA of the metadata MDTA and the program request that is for the content data CDTA of the metadata MDTA and that is related to the program request for the header data HDTA, regardless of respective processing results, so that an overhead of the firmware unit that is the first function block FCU1 may be decreased. In this regard, the control method by the memory system according to the embodiment of FIG. 19 is different from a method of a flowchart of FIG. 20 that is a comparative example in which, after a program request for header data of metadata is completely processed ('YES' of SRD), a program request for content data of metadata is processed.

In the embodiment of FIG. 19, a check of whether the program request for the header data HDTA of the metadata MDTA and the program request for the content data CDTA of the metadata MDTA are complete (operation S1960), and a process for a next request (operation S1980) may be the same as those in the embodiment of FIG. 14, thus, detailed descriptions thereof are omitted here.

Figure 21:
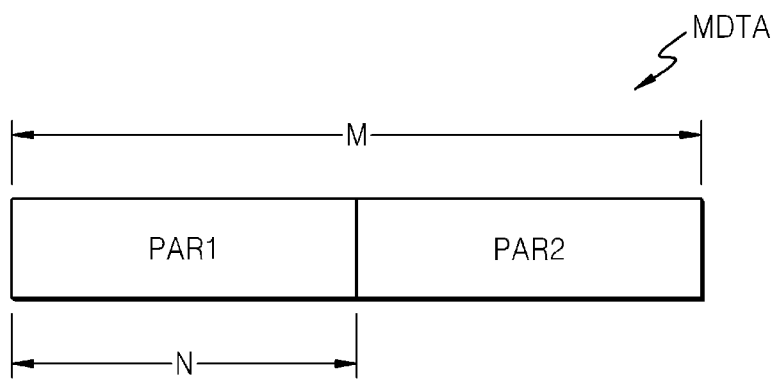
FIGS. 21 and 22 illustrate an example of the control method of FIG. 1, according to another embodiment of the inventive concepts.
Figure 22:
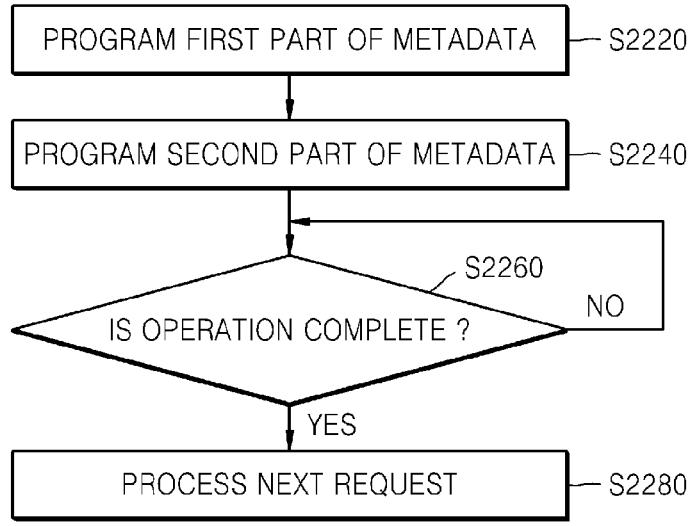

FIGS. 21 and 22 illustrate an example of the control method of FIG. 1, according to another embodiment of the inventive concepts.

Referring to FIGS. 1, 2, and 21, the second function block FCU2 of the memory system MSYS may store metadata MDTA in a storage area. The storage area of the second function block FCU2 may be the aforementioned memory. Since a size of user data, such as high-quality multimedia data that is required to be processed in a memory, is increased, and a control scheme for the memory is complicated, a size of the metadata MDTA that corresponds to the user data may also be increased.

Thus, as illustrated in FIG. 21, it may occur that the size of the metadata MDTA is M, whereas a size of data that can be processed via one program request is N. In this case, a program request for the metadata MDTA may include a program request for a first part PAR1 of the metadata MDTA and a program request for a second part PAR2 of the metadata MDTA. When one of the program requests for the first and second parts PAR1 and PAR2 of the metadata MDTA is processed as fail, a program processing result of the other part of the metadata MDTA may be meaningless.

In an example of FIG. 21, the main request MREQ of FIGS. 1 and 2 may include a program command for the metadata MDTA, the first sub-request SREQ1 may include a program command for the first part PAR1 of the metadata MDTA, and the second sub-request SREQ2 may include a program command for the second part PAR2 of the metadata MDTA.

The control method by the memory system with respect to the example of FIG. 21 may be performed according to a flowchart of FIG. 22. For example, the control method by the memory system according to the flowchart of FIG. 22 may involve programming the first part PAR1 of the metadata MDTA in response to the first sub-request SREQ1 (operation S2220), and programming the second part PAR2 of the metadata MDTA in response to the second sub-request SREQ2, regardless of whether the programming of the first part PAR1 of the metadata MDTA is complete (operation S2240).

Figure 23:
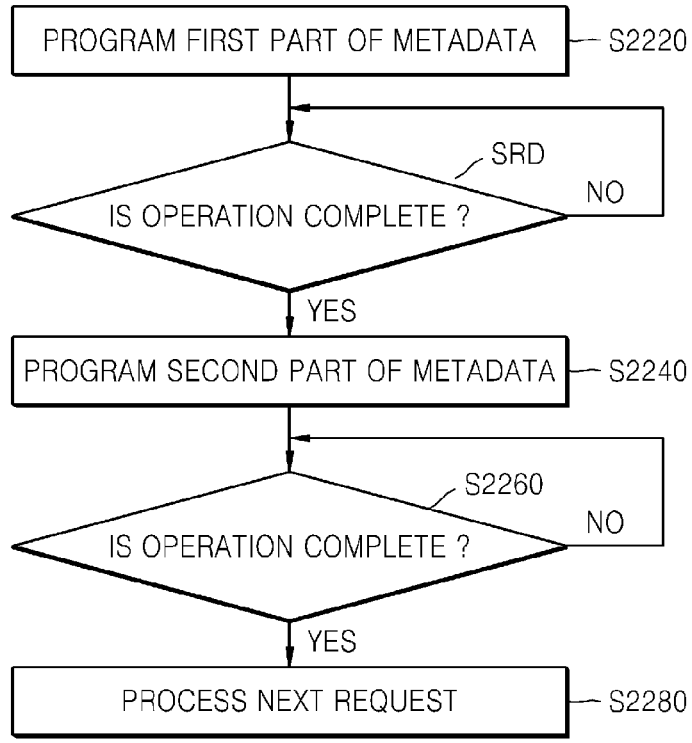
FIG. 23 illustrates a control method according to a comparative example with respect to the control method of FIG. 22.

As described above, the control method according to the embodiment of FIG. 22 may separately perform the program request for the first part PAR1 of the metadata MDTA and the program request that is for the second part PAR2 of the metadata MDTA and that is related to the program request for the first part PAR1, regardless of respective processing results, so that an overhead of the firmware unit that is the first function block FCU1 may be decreased. In this regard, the control method by the memory system according to the embodiment of FIG. 22 is different from a method of a flowchart of FIG. 23 that is a comparative example in which, after a program request for a first part of metadata is completely processed ('YES' of SRD), a program request for a second part of metadata is processed.

In the embodiment of FIG. 22, a check of whether the program request for the first part PAR1 of the metadata MDTA and the program request for the second part PAR2 of the metadata MDTA are complete (operation S2260), and a process for a next request (operation S2280) may be the same as those in the embodiment of FIG. 14, thus, detailed descriptions thereof are omitted here.

Referring to FIG. 21, for convenience of description, the metadata MDTA is divided into the first part PAR1 and the second part PAR2 that have the same size and that correspond to a program amount N, but the one or more embodiments of the inventive concepts are not limited thereto. The metadata MDTA may be divided into at least three parts for an optimized programming operation, and the three parts may have different sizes. In this case, a program of each of the three parts of the metadata MDTA may be controlled by using the aforementioned control method according to the embodiment of FIG. 22.

According to the control method by the memory system in the one or more embodiments of the inventive concepts, the first sub-request SREQ1 and the second sub-request SREQ2 are performed in different processes. For example, in the embodiment of FIG. 14, the program request for the LSB page and the program request for the MSB page are performed in operation S1420 and operation S1440, respectively. Also, in the embodiment of FIG. 22, the program request for the first part PAR1 of the metadata MDTA and the program request for the second part PAR2 of the metadata MDTA are performed in operation S2220 and operation S2240, respectively. In this regard, the separate operations means that the operations are separate ones and not that they are performed at different points of time.

Figure 24:
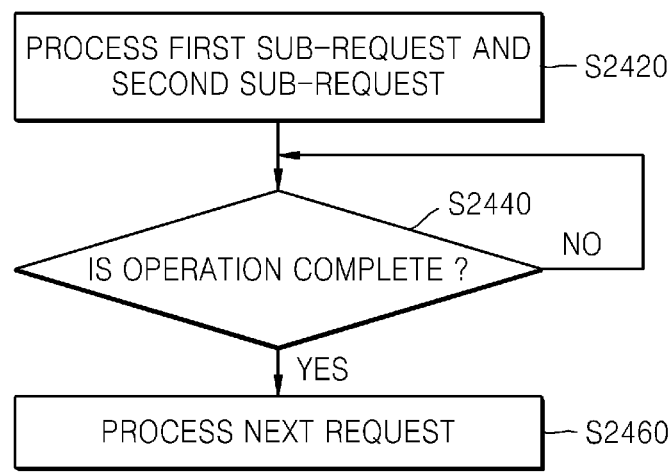
FIG. 24 is a flowchart of a control method performed by a memory system, according to another embodiment of the inventive concepts.

In the control method by the memory system according to the one or more embodiments of the inventive concepts, as illustrated in a flowchart of FIG. 24, the first sub-request SREQ1 and the second sub-request SREQ2 may be simultaneously processed.

Figure 25:
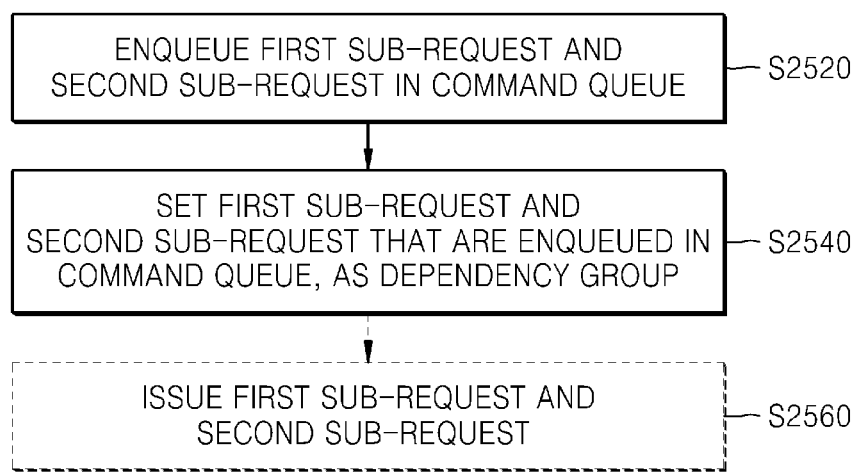
FIG. 25 is a flowchart of a queuing operation performed by a third function block, according to an embodiment of the inventive concepts.

FIG. 25 is a flowchart of a queuing operation performed by the third function block FCU3, according to an embodiment of the inventive concepts. FIG. 26 illustrates an example of a command queue CMDQ that is included in the third function block FCU3.

Referring to FIGS. 2, 25, and 26, the first sub-request SREQ1 and the second sub-request SREQ2 that are included in the main request MREQ that is received from the first function block FCU1 may be enqueued in the command queue CMDQ that is included in the third function block FCU3 (operation S2520). As described above with reference to FIG. 5, the third function block FCU3 may be the NAND manager.

Requests are output (i.e., the requests are dequeued) according to an order of input to the command queue CMDQ. For example, in the example of FIG. 26, a request REQ1 that corresponds to a first index QID#1 in a list of the command queue CMDQ is first enqueued, compared to other requests REQ2 through REQ6 that correspond to indexes QID#2 through QID#6, and is first dequeued (in an arrow direction).

The third function block FCU3 may set dependency groups with respect to the requests that are enqueued in the command queue CMDQ (operation S2540). For example, in the list of the command queue CMDQ of FIG. 26, the requests REQ1 and REQ2 that correspond to the first index QID#1 and the second index QID#2, respectively, may be set as a first dependency group DGRP1, and the requests REQ4 through REQ6 that correspond to the fourth through sixth indexes QID#4 through QID#6, respectively, may be set as a second dependency group DGRP2.

FIG. 26 illustrates the example in which the dependency groups are set in a manner that flags FLG are added to the requests REQ1 through REQ6, respectively, which are enqueued in the command queue CMDQ. For example, the first request REQ1 is applied 0 as the flag FLG since the first request REQ1 is not dependent upon a request that is enqueued before the first request REQ1 is enqueued, and the second request REQ2 is applied 1 as the flag FLG since the second request REQ2 is dependent upon the first request REQ1 that is enqueued before the second request REQ2. Existence or non-existence of dependency may be recognized by detecting whether the first request REQ1 and the second request REQ2 are included in the same main request MREQ. The third request REQ3 is applied 0 as the flag FLG since the third request REQ3 is not dependent upon a request that is enqueued before the third request REQ3 is enqueued, and the fourth request REQ4 is applied 0 as the flag FLG since the fourth request REQ4 is not dependent upon a request that is enqueued before the fourth request REQ4 is enqueued. On the other hand, the fifth and sixth requests REQ5 and REQ6 are applied 1 as the flag FLG since the fifth and sixth requests REQ5 and REQ6 are dependent upon the fourth request REQ4 that is enqueued before the fifth and sixth requests REQ5 and REQ6 are enqueued.

However, the one or more embodiments of the inventive concepts are not limited thereto. As illustrated in FIG. 27, dependency groups may be set by forming a table including a plurality of pieces of information about relations among the requests REQ1 through REQ6 that are enqueued in the command queue CMDQ. FIG. 27 illustrates an example of the table including a plurality of pieces of information indicating that requests that are included in a first dependency group DGRP1 of a first index Ind1 of the table are positioned in a first index QID#1 and a second index QID#2 of the command queue CMDQ, and requests that are included in a second dependency group DGRP2 of a second index Ind2 of the table are positioned in fourth through sixth indexes QID#4 through QID#6 of the command queue CMDQ.

Referring back to FIGS. 2, 25, and 26, the requests are issued when the requests are sequentially dequeued from the command queue CMDQ, respectively (operation S2560). For example, the first control signal XCON1 and the second control signal XCON2 about the first sub-request SREQ1 and the second sub-request SREQ2 are transmitted to the second function block FCU2. Due to a dequeuing process at the command queue CMDQ, index values of the list of the command queue CMDQ may be changed, and referring to FIG. 27, index values of the table may be changed in response to the change in the command queue CMDQ.

Figure 28:
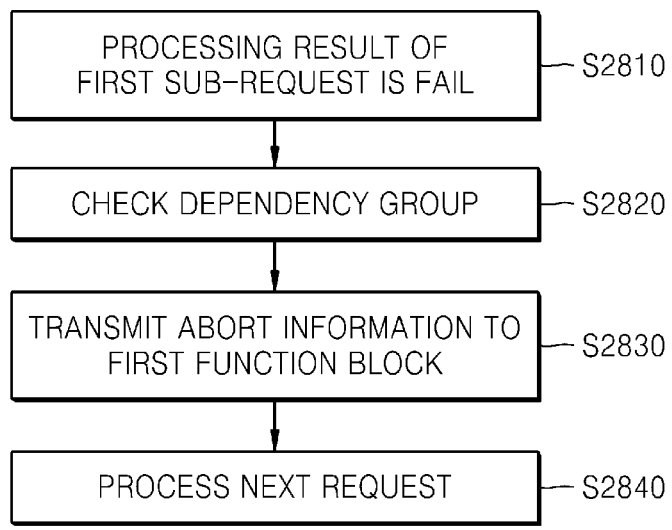
FIG. 28 is a flowchart of operations with respect to a main response of the third function block, according to an embodiment of the inventive concepts.

FIG. 28 is a flowchart of operations with respect to the main response MRSP of the third function block FCU3, according to an embodiment of the inventive concepts.

Referring to FIGS. 2 and 28, the control method by the memory system MSYS may involve referring to a dependency group and then checking whether the second sub-request SREQ2 is included in the dependency group (operation 52820) when a processing result of the first sub-request SREQ1 performed by the third function block FCU3 is a fail (operation S2810), and when the dependency group includes the second sub-request SREQ2, the control method may involve outputting the abortion information ABORT as the main response MRSP in response to the main request MREQ (operation S2830). Afterward, a next request is processed (operation S2840). For convenience of description, FIG. 28 illustrates the embodiment in which the processing result of the first sub-request SREQ1 is a fail. However, the flowchart of FIG. 28 may be equally applied to an embodiment in which the processing result of the second sub-request SREQ2 is a fail.

Figure 29:
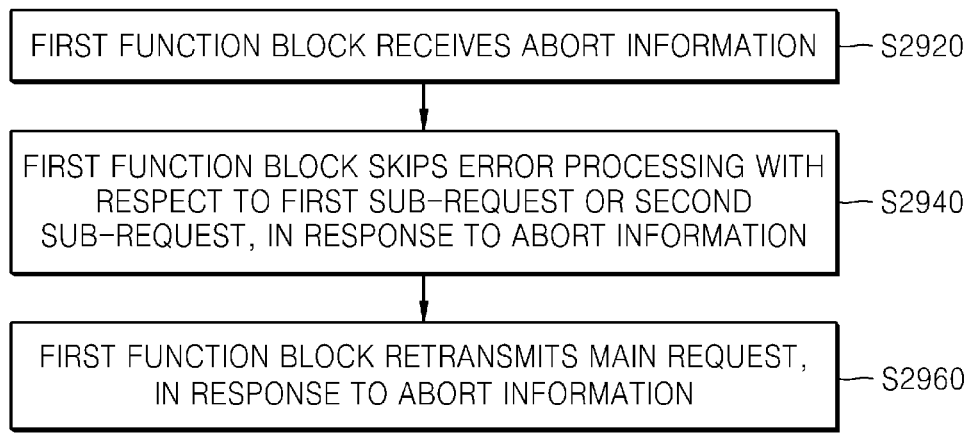
FIG. 29 is a flowchart of processes that are performed by a first function block FCU1 and that correspond to the main response, according to an embodiment of the inventive concepts.

FIG. 29 is a flowchart of processes that are performed by the first function block FCU1 and that correspond to the main response MRSP, according to an embodiment of the inventive concepts.

Referring to FIGS. 2 and 29, the control method by the memory system MSYS may further involve skipping an error process with respect to the main request MREQ (operation S2940) when the first function block FCU1 receives the abortion information ABORT as the main response MRSP (operation S2920). As described above, the abortion information ABORT may be transmitted when at least one of the processing results of the first sub-request SREQ1 and the second sub-request SREQ2 included in the main request MREQ is a fail. In operation S2960, the first function block FCU1 may retransmit the main request MREQ in response to the abort information ABORT.

Figure 30:
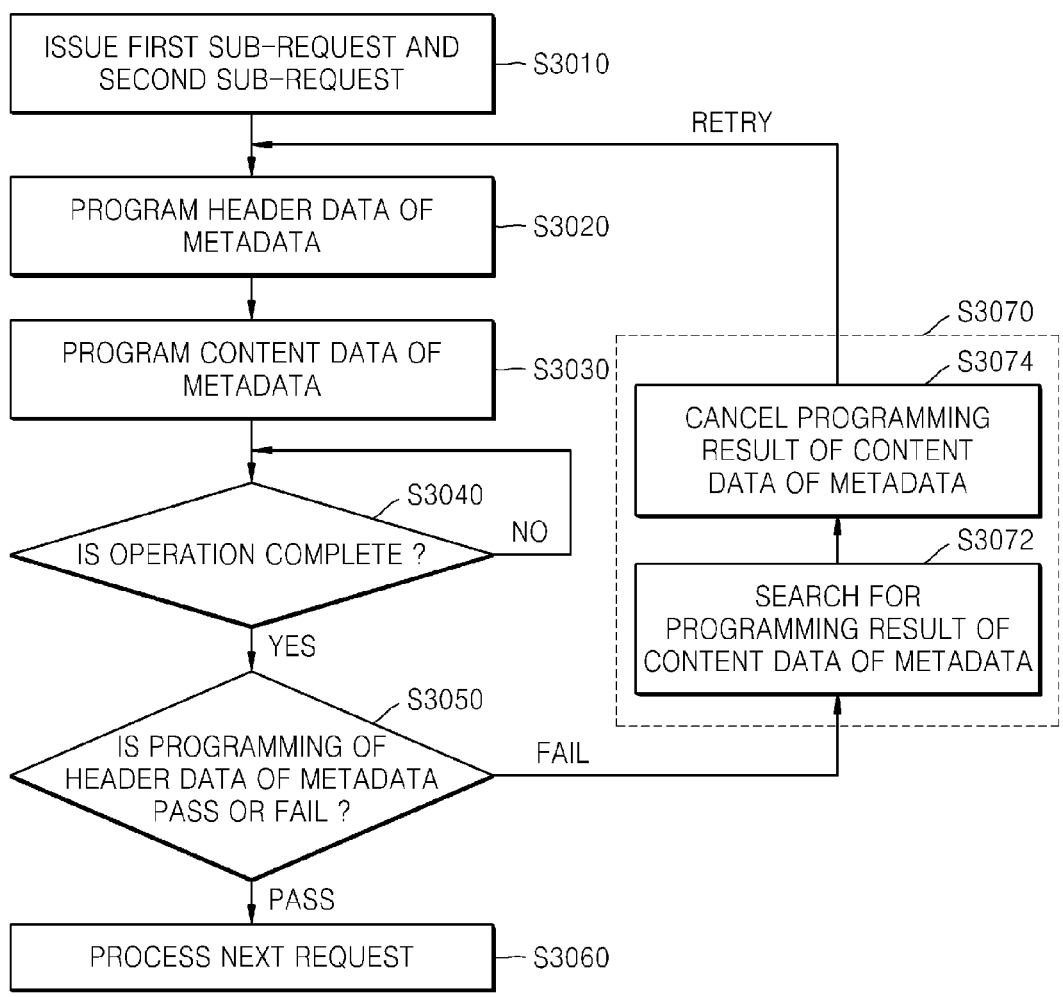
FIG. 30 is a flowchart of a control method that is a comparative example with respect to the control method performed by the memory system according to the embodiments of the inventive concepts.

FIG. 30 is a flowchart of a control method that is a comparative example with respect to the control method performed by the memory system according to the one or more embodiments of the inventive concepts. Referring to FIG. 30, the flowchart illustrates request processing and error handling of a case in FIG. 18 in which the program request for the header data HDTA of the metadata MDTA is the first sub-request SREQ1, and the program request for the content data CDTA of the metadata MDTA is the second sub-request SREQ2.

When the first sub-request SREQ1 and the second sub-request SREQ2 are issued (operation S3010), and a process of the first sub-request SREQ1 (operation S3020) and a process of the second sub-request SREQ2 (operation S3030) are complete ('YES' of operation S3040), it is determined whether the process of the first sub-request SREQ1 is a pass or a fail (operation S3050). If the process of the first sub-request SREQ1 is a pass ('YES' of operation S3050), a next request is processed (operation S3060).

On the other hand, if the process of the first sub-request SREQ1 is a fail ('NO' of operation S3050), the error handling is performed (operation S3070). The error handling (operation S3070) involves searching for a processing result of the second sub-request SREQ2 (operation S3072) and cancelling the processing result of the second sub-request SREQ2 (operation S3074). The error handling (operation S3070) may be performed in a manner that processing information about the second sub-request SREQ2, which is updated to the local memory LMEM of FIG. 6, may be searched and deleted.

Referring back to FIGS. 2 and 29, the control method by the memory system MSYS according to the present embodiment may further involve re-transmitting, by the first function block FCU1, the main request MREQ in response to the abortion information ABORT. As described above, in the memory device MDEV, the memory system MSYS, and the control method performed by the memory system MSYS according to the one or more embodiments of the inventive concepts, a plurality of related requests may be processed together, or error handling may be skipped and the main request MREQ, including a failed sub-request, may be retried, so that an overhead or complexity of a design may be decreased.

Figure 31:
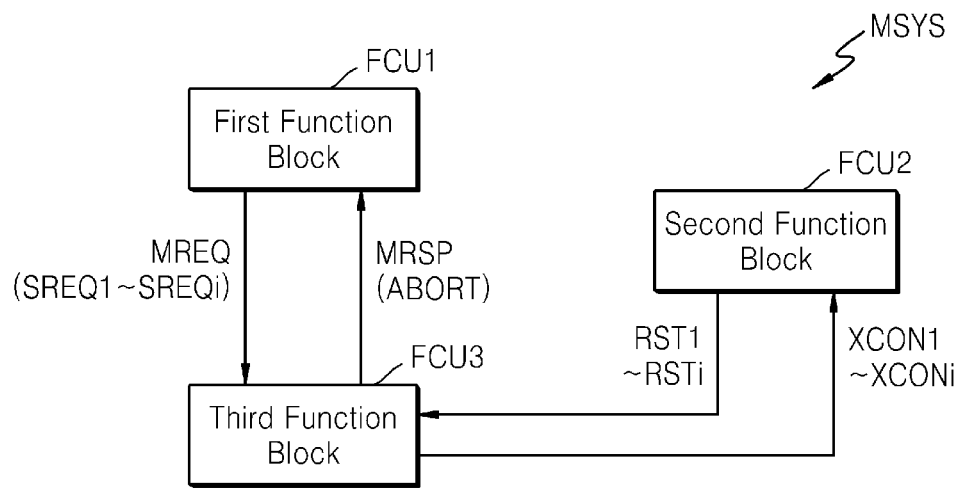
FIGS. 31, 32, 33A, 33B and 34 illustrate memory systems, according to other embodiments of the inventive concepts.

In the above embodiments, the main request MREQ includes the first sub-request SREQ1 and the second sub-request SREQ2. However, the one or more embodiments of the inventive concepts are not limited thereto. As illustrated in FIG. 31, the memory system MSYS may include the main request MREQ that includes at least three sub-requests SREQ1 through SREQi (here, i is an integer equal to or greater than 3), and processes (i.e., XCON1 through XCONi, RST1 through RSTi) are performed on the at least three sub-requests SREQ1 through SREQi, respectively, so that a common main request MREQ may be generated.

Figure 32:
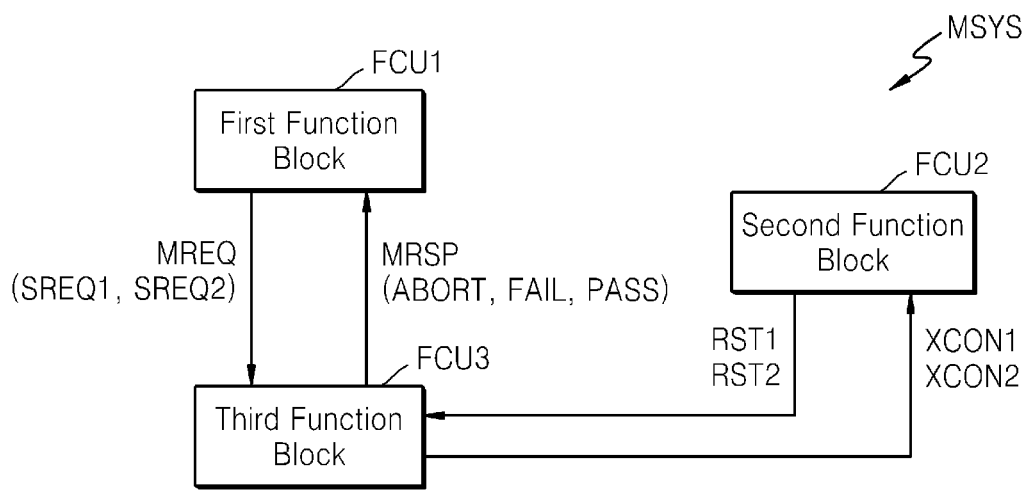

In the above embodiments, a normal process is not performed on the main request MREQ, and the abortion information ABORT is transmitted. However, as illustrated in FIG. 32, in the memory system MSYS according to another embodiment, not only the abortion information ABORT but also fail information FAIL may be transmitted to the first function block FCU1.

The fail information FAIL may be transmitted when both of the first sub-request SREQ1 and the second sub-request SREQ2 included in the main request MREQ are fails, or when the second function block FCU2 or the third function block FCU3 cannot process the main request MREQ, regardless of processing the first sub-request SREQ1 and the second sub-request SREQ2. As described above, when the main request MREQ is normally processed, the main response MRSP may be transmitted as pass information PASS.

Figure 33A:
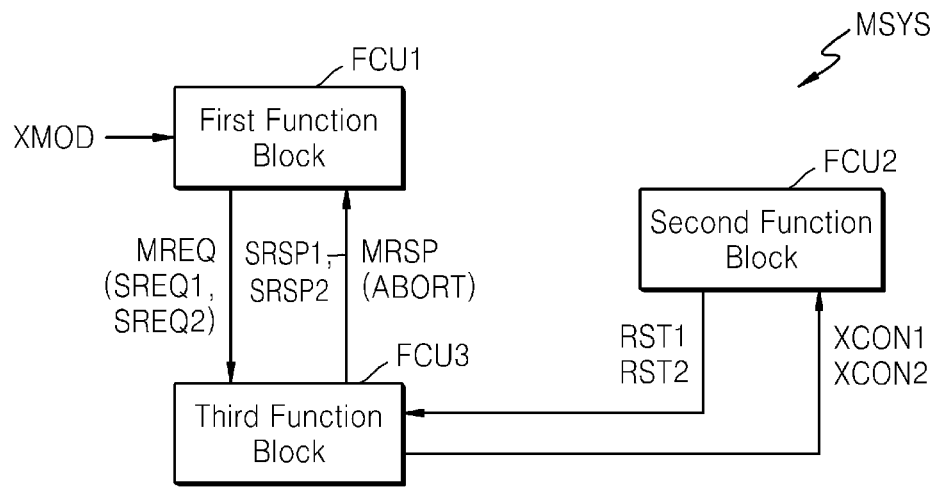
Figure 33B:
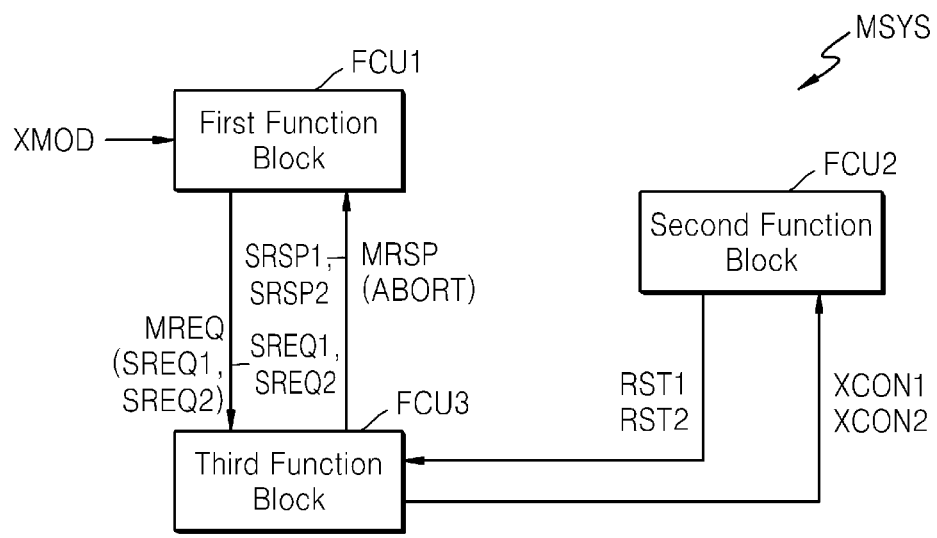

As illustrated in FIGS. 33A and 33B, the memory system MSYS according to the one or more embodiments of the inventive concepts may be controlled by using a method other than the aforementioned control method, in response to a mode signal XMOD. For example, as illustrated in FIG. 33A, the memory system MSYS may operate according to the control method of FIG. 1, in response to a first logic level of the mode signal XMOD, and may separately transmit, in response to the main request MREQ and a second logic level of the mode signal XMOD, a first sub-response SRSP1 for the processing result of the first sub-request SREQ1 and a second sub-response SRSP2 for the processing result of the second sub-request SREQ2 to the first function block FCU1.

Alternatively, as illustrated in FIG. 33B, the memory system MSYS may operate according to the control method of FIG. 1, in response to a first logic level of the mode signal XMOD, may separately transmit, in response to a second logic level of the mode signal XMOD, the first sub-request SREQ1 and the second sub-request SREQ2, not the main request MREQ, to the third function block FCU3, and may separately transmit a first sub-response SRSP1 for the processing result of the first sub-request SREQ1 and a second sub-response SRSP2 for the processing result of the second sub-request SREQ2 to the first function block FCU1.

The mode signal XMOD may have a logic level that is adaptively set according to a function and resource allocation that are required for the memory system MSYS or the memory device MDEV in a specific situation. For example, when it is requested to decrease an overhead of firmware, the mode signal XMOD may be set as the aforementioned first logic level. Alternatively, when a resource is enough or an overhead of firmware does not cause trouble although the first sub-request SREQ1 and the second sub-request SREQ2 are separately processed, the mode signal XMOD may be set as the aforementioned second logic level.

Figure 34:
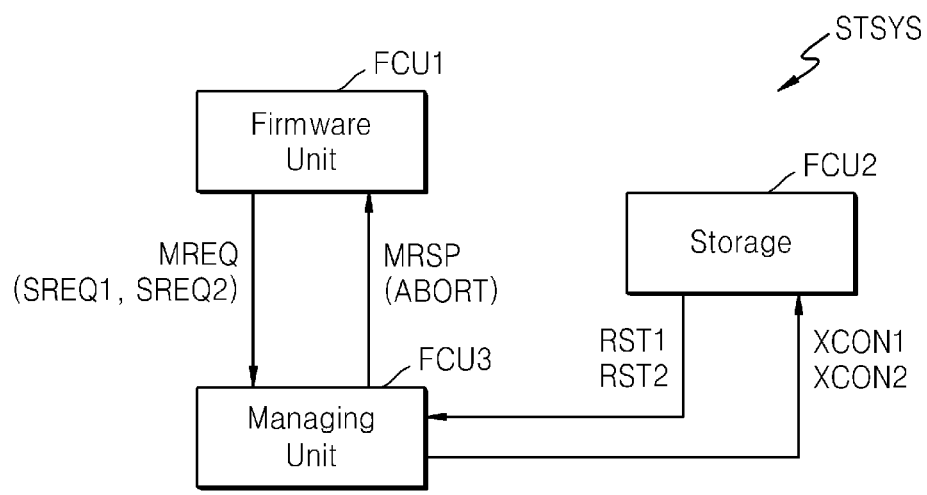

In the above embodiments, the control method performed by the memory system MSYS is described. However, the one or more embodiments of the inventive concepts are not limited thereto. Thus, as illustrated in FIG. 34, the control method according to the one or more embodiments of the inventive concepts may also be applied to a storage system STSYS that has a storage device Storage, which includes a storage means other than a memory, as the second function block FCU2.

Figure 35:
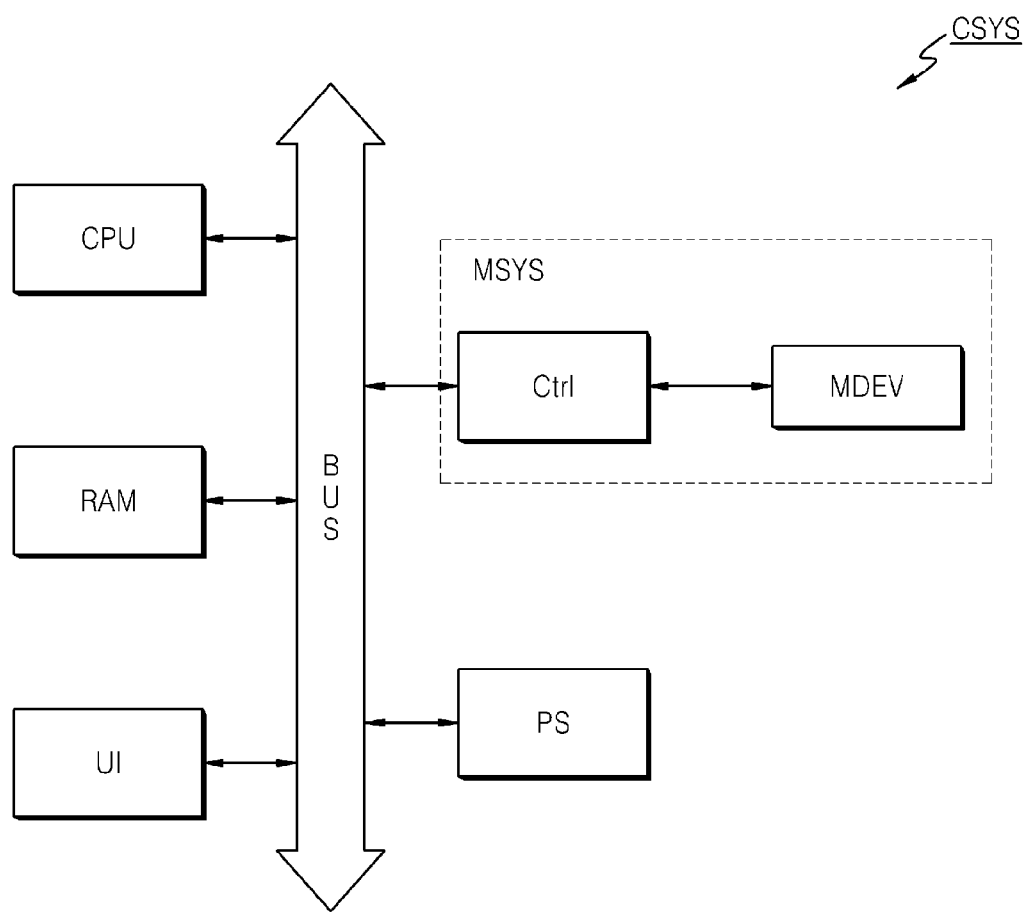
FIG. 35 illustrates a computer system according to an embodiment of the inventive concepts.

FIG. 35 illustrates a computer system CSYS according to an embodiment of the inventive concepts.

Referring to FIG. 35, the computer system CSYS includes a processor CPU, a user interface UI, and a memory system MSYS that are electrically connected to a bus BUS. The memory system MSYS may correspond to the memory system MSYS of FIG. 2 or the like. A memory device MDEV included in the memory system MSYS may correspond to the memory device MDEV of FIG. 3 or the like. Thus, when the computer system CSYS according to the present embodiment processes a request for the memory device MDEV or the memory system MSYS, the computer system CSYS may efficiently operate by decreasing an overhead, so that the computer system CSYS may improve a performance of the memory device MDEV or the memory system MSYS.

The computer system CSYS may further include a power supply PS. Also, the computer system CSYS may further include a volatile memory device (such as RAM) for data transmission and reception between the processor CPU and the memory system MSYS.

When the computer system CSYS is included in a mobile device, a battery and a modem, such as a baseband chipset, may be additionally provided to supply an operating voltage to the computer system CSYS. Also, it is obvious to one of ordinary skill in the art that an application chipset, a camera image processor (CIS), mobile DRAM, or the like may be further provided to the computer system CSYS, so that further descriptions are omitted here.

Figure 36:
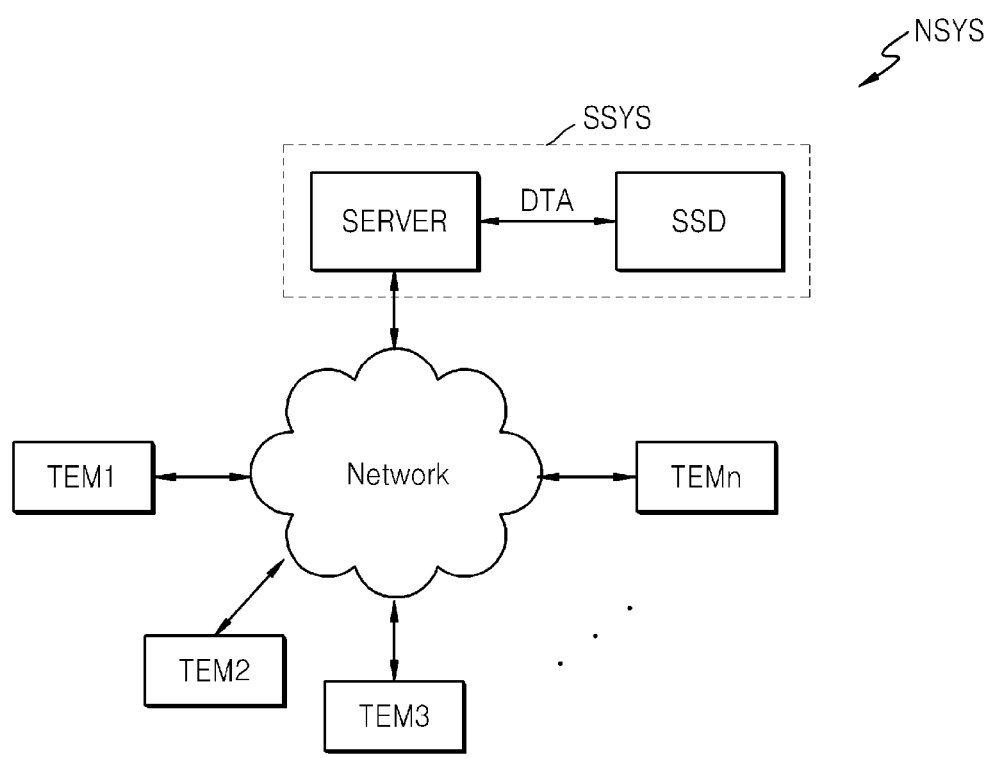
FIG. 36 illustrates a server system and a network system, according to an embodiment of the inventive concepts.

FIG. 36 illustrates a server system SSYS and a network system NSYS, according to an embodiment of the inventive concepts.

Referring to FIG. 36, the network system NSYS may include the server system SSYS and a plurality of terminals TEM1 through TEMn that are connected via a network. The server system SSYS may include a server SERVER that processes requests from the plurality of terminals TEM1 through TEMn that are connected to the network, and an SSD that stores data corresponding to the requests from the plurality of terminals TEM1 through TEMn. Here, the SSD of FIG. 36 may correspond to the SSD of FIG. 7. Thus, when the network system NSYS and the server system SSYS according to the present embodiment process a request for the memory device MDEV or the memory system MSYS, the network system NSYS and the server system SSYS may efficiently operate by decreasing an overhead, so that the network system NSYS and the server system SSYS may improve a performance of the memory device MDEV or the memory system MSYS.

While the inventive concepts has been particularly shown and described with reference to exemplary embodiments thereof, it will be understood that various changes in form and details may be made therein without departing from the spirit and scope of the following claims.

What is claimed is:

1. A control method performed by a non-volatile memory system comprising a memory controller and memory device, the control method comprising:
    receiving an operation request from an external source by a firmware unit of the memory controller;
    in response to receiving the operation request, generating, by the firmware unit, a main request comprising a first sub-request and a second sub-request; wherein the first sub-request is for a first operation of the main request, and the second sub-request is for a second operation of the main request that is dependent upon a processing result of the first operation;
    transmitting the first and second sub-requests from the firmware unit to a memory management unit of the memory controller;
    in response to receiving the first and second sub-requests, controlling, by the memory management unit, the memory device to initiate the first and second operations, wherein the memory management unit initiates the second operation without waiting for an indication from the memory device that the first operation is complete;
    receiving a processing result of the first operation by the memory management unit from the memory device; and
    in response to receiving the processing result and determining the processing result indicates the status of the first sub-request is a fail, transmitting, by the memory management unit, abortion information to the firmware unit, wherein the transmitting of the abortion information is performed even if processing of the second sub-request has not completed.

2. The control method of claim 1, wherein the firmware unit includes commands and data to perform machine code processing that is used by the memory system to process the operation request from the external source.

3. The control method of claim 1, wherein, in response to the operation request containing a program command, the first sub-request includes a backup program command for a least significant bit (LSB) page of the memory device, the LSB page and a most significant bit (MSB) page of the memory device form a pair, and the second sub-request includes a command to program the MSB page to a word line of the memory device to which the LSB page was programmed.

4. The control method of claim 3, further comprising:
    processing the first sub-request; and
    processing the second sub-request,
    wherein the processing of the first sub-request comprises:
        initiating programming of the LSB page by the memory management unit, and
    wherein the processing of the second sub-request comprises:
        initiating programming of the MSB page by the memory management unit, even if the programming of the LSB page is not complete.

5. The control method of claim 1, wherein, in response to the operation request containing a program command for a first memory block of the memory device, the first sub-request includes an erase command for the first memory block, and the second sub-request includes a program command for a first page of the first memory block.

6. The control method of claim 5, further comprising:
    processing the first sub-request; and
    processing the second sub-request,
    wherein the processing of the first sub-request comprises:
        initiating erasing of the first memory block by the memory management unit; and
    the processing of the second sub-request comprises:
        initiating programming of the first page by the memory management unit, without waiting for an indication that the erasing of the first memory block is complete.

7. The control method of claim 1, wherein in response to the operation request containing a program command for programming metadata in the memory device, the first sub-request includes a program command for header data of the metadata, and the second sub-request includes a program command for content data of the metadata.

8. The control method of claim 7, further comprising:
    processing the first sub-request; and
    processing the second sub-request,
    wherein the processing of the first sub-request comprises:
        initiating programming of the header data by the memory management unit; and
    the processing of the second sub-request comprises:
        initiating programming the content data by the memory management unit, even if the programming of the header data is not complete.

9. The control method of claim 1, wherein, in response to the operation request containing a program command for programming metadata in the memory device, the first sub-request includes a program command for a first part of the metadata, and the second sub-request includes a program command for a second part of the metadata.

10. The control method of claim 9, further comprising:
    processing the first sub-request; and
    processing the second sub-request,
    wherein the processing of the first sub-request comprises:
        initiating programming of the first part of the metadata by the memory management unit; and
    the processing of the second sub-request comprises:
        programming the second part of the metadata by the memory management unit, even if the programming of the first part of the metadata is not complete.

11. The control method of claim 1, further comprising:
    sequentially processing the first sub-request and the second sub-request.

12. The control method of claim 1, wherein the memory device includes a command queue, and the control method further comprises: enqueuing the first sub-request and the second sub-request in the command queue; and setting the first sub-request and the second sub-request that are enqueued in the command queue as a dependency group.

13. The control method of claim 12, wherein the transmitting abortion information to the firmware unit comprises: determining whether the processing result of the first sub-request has failed; in response to determining the processing result of the first sub-request has failed, referring to the dependency group, and checking whether the second sub-request is included in the dependency group; and outputting the abortion information with respect to the main request, when the checking indicates the second sub-request is included in the dependency group.

14. The control method of claim 1, wherein, in response to receiving the abortion information, error processing is not performed by firmware unit with respect to the first sub-request or the second sub-request.

15. The control method of claim 1, further comprising: retransmitting the main request in response to the abortion information, by the firmware unit.

16. The control method of claim 1, wherein the main request further includes a third sub-request that requires an operation that is dependent upon a processing result of at least one of the first sub-request and the second sub-request, and the transmitting abortion information to the firmware unit includes transmitting the abortion information to the firmware unit in response to the main request without processing either of the second sub-request and the third sub-request, when the processing result of the first sub-request is a fail.

17. An input and output processing method performed by a NAND flash memory system including a memory controller and a NAND flash device, the input and output processing method comprising:
  receiving an operation request from an external source by a firmware unit included in the memory controller;
  in response to receiving the operation request, generating, by the firmware unit, a main request including a first sub-request and a second sub-request; wherein the first sub-request is for a first operation of the main request, and the second sub-request is for a second operation of the main request that is dependent upon the first operation;
  the firmware unit includes commands and data associated with processing a request from the external source;
  enqueuing at least one of the first sub-request or the second sub-request in a command queue included in the memory controller, the enqueuing is performed by a managing unit that is included in the memory controller and controls the NAND flash device;
  the managing unit processing the first sub-request by initiating the first operation; and the managing unit processing the second sub-request by initiating the second operation without waiting for an indication from the NAND flash device that the first operation is complete; and outputting, by the managing unit, abortion information associated with the main request to the firmware unit, in response to the NAND flash device indicating a processing result of the first sub-request is a fail, the outputting being performed even if the processing of the second sub-request is not complete.

18. The input and output processing method of claim 17, wherein the outputting of abortion information to the firmware unit comprises: determining whether the processing result of the first sub-request is a fail; when the processing result of the first sub-request is a fail, checking information about a dependency group including the first sub-request; and in response to determining the second sub-request is included in the dependency group by referring to the information about the dependency group, transmitting the abortion information to the firmware unit.

19. The input and output processing method of claim 18, wherein, in response to the firmware unit receiving the abortion information, error processing is not completed with respect to at least one of the first sub-request and the second sub-request by the firmware unit, and the firmware unit retransmits the main request to the managing unit.

20. A non-volatile memory system comprising:
  a memory device to process a first sub-request and a second sub-request, wherein the second sub-request is dependent upon a processing result of the first sub-request; and
  a memory controller to control the memory device to process the first sub-request and the second sub-request, wherein the memory controller includes:
  a firmware unit that includes commands and data to process requests from an external source;
  the firmware unit configured to, in response to receiving an operation request from the external source, output a main request including the first sub-request and the second sub-request, and generate a processing result of the main request; and
  a managing unit to control the memory device, the managing unit being configured to:
    receive the main request,
    in response to receiving the main request, set the first sub-request and the second sub-request as a dependency group,
    in response to setting the dependency group, enqueue the first sub-request and the second sub-request in a command queue, and control the memory device to process the first and second sub-requests wherein the second sub-request is processed prior to receiving a processing result of the first sub-request,
    receive a processing result for the first sub-request associated with the main request, and
    in response to receiving the processing result and determining the result indicates the status of the first sub-request is a fail, transmit abortion information to the firmware unit, even if the processing of the second sub-request is not complete.

21. The memory system of claim 20, wherein the memory system is configured such that, in response to the abortion information, the firmware unit does not perform error processing with respect to at least one of the first sub-request and the second sub-request, and the firmware unit retransmits the main request to the managing unit.

22. The memory system of claim 20, wherein the memory system includes at least one NAND flash memory device as the memory device, and the command queue is arranged at each channel between the memory controller and at least one NAND flash memory device.

* * * * *